US009666656B2

(12) United States Patent
Tomida et al.

(10) Patent No.: US 9,666,656 B2
(45) Date of Patent: May 30, 2017

(54) SELF-LIGHT EMITTING DISPLAY UNIT AND ELECTRONIC DEVICE

(71) Applicant: Sony Corporation, Tokyo (JP)

(72) Inventors: Masatsugu Tomida, Aichi (JP); Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/191,568

(22) Filed: Jun. 24, 2016

(65) Prior Publication Data
US 2016/0307984 A1 Oct. 20, 2016

Related U.S. Application Data

(63) Continuation of application No. 14/690,811, filed on Apr. 20, 2015, now Pat. No. 9,397,147, which is a (Continued)

(30) Foreign Application Priority Data

Jun. 18, 2008 (JP) ................................. 2008-159169

(51) Int. Cl.
 H01J 1/62      (2006.01)
 H01L 27/32     (2006.01)
 G09G 3/3233    (2016.01)
 H05B 33/06     (2006.01)
 G09G 3/20      (2006.01)

(52) U.S. Cl.
CPC ....... *H01L 27/3265* (2013.01); *G09G 3/2003* (2013.01); *G09G 3/3233* (2013.01); *H01L 27/3211* (2013.01); *H01L 27/3216* (2013.01); *H01L 27/3218* (2013.01); *H01L 27/3248* (2013.01); *H01L 27/3262* (2013.01); *H05B 33/06* (2013.01); *G09G 2300/0426* (2013.01); *G09G 2320/0209* (2013.01);
(Continued)

(58) Field of Classification Search
CPC ..................... G09G 3/3233; G09G 2300/0861
USPC ......................................... 313/498, 504, 506
See application file for complete search history.

(56) References Cited

U.S. PATENT DOCUMENTS

| 6,429,601 B1 | 8/2002 | Friend et al. |
| 2007/0268210 A1 | 11/2007 | Uchino et al. |
| 2008/0136795 A1 | 6/2008 | Numao et al. |

FOREIGN PATENT DOCUMENTS

| JP | 2001-290441 A | 10/2001 |
| JP | 2002-504717 T | 2/2002 |

(Continued)

OTHER PUBLICATIONS

Japanese Office Action issued Apr. 8, 2010 for corresponding Japanese Application No. 2008-159169.
(Continued)

*Primary Examiner* — Vip Patel
(74) *Attorney, Agent, or Firm* — Michael Best & Friedrich LLP

(57) ABSTRACT

A self-light emitting display unit capable of improving manufacturing yield is provided. Sizes of color pixel circuits corresponding to pixels for R, G, and B are respectively set unevenly within a pixel circuit according to a magnitude ratio of drive currents which allow color self-light emitting elements in the pixel to emit with a same light emission luminance. Thereby, the pattern densities of color pixel circuits respectively corresponding to the pixels for R, G, and B become even to each other, and the pattern defect rate as the whole pixel circuit is decreased.

6 Claims, 22 Drawing Sheets

Related U.S. Application Data continuation of application No. 14/230,634, filed on Mar. 31, 2014, now Pat. No. 9,041,281, which is a continuation of application No. 14/081,611, filed on Nov. 15, 2013, now Pat. No. 8,723,416, which is a continuation of application No. 13/873,722, filed on Apr. 30, 2013, now Pat. No. 8,610,348, which is a continuation of application No. 12/457,314, filed on Jun. 8, 2009, now Pat. No. 8,446,092.

(52) U.S. Cl.
CPC ...... *G09G 2320/043* (2013.01); *H01L 27/326* (2013.01); *H01L 2227/32* (2013.01)

(56) References Cited

FOREIGN PATENT DOCUMENTS

| JP | 2002-318556 A | 10/2002 |
|---|---|---|
| JP | 2003-015551 A | 1/2003 |
| JP | 2003-202817 A | 7/2003 |
| JP | 2005-085737 A | 3/2005 |
| JP | 2006-244892 A | 9/2006 |
| JP | 2006-308768 A | 11/2006 |
| JP | 2006-313350 A | 11/2006 |
| JP | 2007-065239 A | 3/2007 |
| JP | 2007-233272 A | 9/2007 |
| JP | 2007-310311 A | 11/2007 |
| KR | 2001-0014509 A | 2/2001 |
| KR | 2006-0114573 A | 11/2006 |
| WO | WO-2006/062858 A2 | 6/2006 |
| WO | WO-2007/075276 A1 | 7/2007 |

OTHER PUBLICATIONS

Japanese Office Action issued Aug. 4, 2010 for corresponding Japanese Application No. 2008-159169.
Korean Office Action issued Dec. 16, 2014 for corresponding Korean Application No. 10-2014-113821.
Korean Office Action issued Jul. 3, 2015 for corresponding Korean Application No. 10-2009-0053864.

SELF-LIGHT EMITTING DISPLAY UNIT AND ELECTRONIC DEVICE

CROSS REFERENCES TO RELATED APPLICATIONS

The present application is a Continuation Application of U.S. patent application Ser. No. 14/690,811 filed Apr. 20, 2015, which is a Continuation Application of U.S. patent application Ser. No. 14/230,634 filed Mar. 31, 2014, now U.S. Pat. No. 9,041,281 issued May 26, 2015, which is a Continuation Application of U.S. patent application Ser. No. 14/081,611 filed Nov. 15, 2013, now U.S. Pat. No. 8,723,416 issued May 13, 2014, which is a Continuation Application of U.S. patent application Ser. No. 13/873,722 filed Apr. 30, 2013, now U.S. Pat. No. 8,610,348 issued Dec. 17, 2013, which is a Continuation of U.S. patent application Ser. No. 12/457,314 filed Jun. 8, 2009, now U.S. Pat. No. 8,446,092 issued May 21, 2013, which in turn claims priority from Japanese Application No. 2008-159169, filed on Jun. 18, 2008, the entire contents of which are incorporated herein by reference.

BACKGROUND OF THE INVENTION

1. Field of the Invention

The present invention relates to a self-light emitting display unit including a self-light emitting device and an electronic device including such a self-light emitting display unit.

2. Description of the Related Art

In recent years, a self-light emitting display unit (organic EL display unit) using an organic EL (Electroluminescence) device as a self-light emitting device has been actively developed. The organic EL device is a device using phenomenon in which light is emitted if an electric field is applied to an organic thin film. Since the organic EL device is able to be driven at, for example, an applied voltage of 10V or less, the power consumption thereof is low. Further, since the organic EL device is a self-light emitting device as described above, an illumination member such as a liquid crystal device is not necessary, and thus weight saving and thickness reducing are thereby easily realized. Further, since the response speed of the organic EL device is enormously high, that is, about several μs, there is an advantage that a residual image in displaying videos is not generated.

Of the organic EL display unit using such an organic EL device, specially, an active matrix organic EL display unit in which a thin film transistor (TFT) as a drive element and the like are integrally formed in each pixel is actively developed (for example, refer to Japanese Unexamined Patent Application Publication No. 2007-310311).

SUMMARY OF THE INVENTION

In the foregoing Japanese Unexamined Patent Application Publication No. 2007-310311 and the like, a pixel circuit formed in each pixel is disclosed. In some cases, sizes of a drive transistor and an accumulated capacitative element of respective pixel circuits for each color, R (red), G (green), and B (blue) differ according to each necessary size of a display drive current. In result, in a pixel circuit for a specific color, the pixel pattern density becomes high, and thus the pattern defect rate is increased due to dust or the like. In the case where the pattern defect rate is increased, the manufacturing yield is lowered.

The foregoing disadvantage exists not only in the case that the self-light emitting device is the organic EL device, but also in the case of an inorganic EL device or an LED (Light Emitting Diode).

In view of the foregoing disadvantage, in the invention, it is desirable to provide a self-light emitting display unit and an electronic device capable of improving the manufacturing yield.

According to an embodiment of the invention, there is provided a first self-light emitting display unit including a pixel layer in which a plurality of pixels are formed, each of the pixels being configured of a plurality of color pixels each having a color self-light emitting element, and a pixel circuit layer in which a plurality of pixel circuits are formed, each of the pixel circuits being configured of a plurality of color pixel circuits which drive the color pixels, respectively. Sizes of the color pixel circuits are set unevenly within the pixel circuit according to a magnitude ratio of drive currents which allow the color self-light emitting elements in the pixel to emit with a same light emission luminance.

According to an embodiment of the invention, there is provided a first electronic device including the foregoing first self-light emitting display unit having a display function.

In the first self-light emitting display unit and the first electronic device of the embodiments of the invention, sizes of the color pixel circuits are set unevenly within the pixel circuit according to a magnitude ratio of drive currents which allow the color self-light emitting elements in the pixel to emit with a same light emission luminance. Thereby, even if device sizes in the pixel circuits are different from each other according to the magnitude of drive currents, in the respective pixels for each color, the pixel pattern densities in the corresponding pixel circuits are even to each other. Thereby, increase of the pattern defect rate due to increase of the pixel pattern density in the pixel circuit for a specific color is avoided, and the pattern defect rate as the whole pixel circuit is decreased.

According to an embodiment of the invention, there is provided a second self-light emitting display unit including a pixel layer in which a plurality of pixels are formed, each of the pixels being configured of a plurality of color pixels each having a color self-light emitting element, and a pixel circuit layer in which a plurality of pixel circuits are formed, each of the pixel circuits being configured of a plurality of color pixel circuits which drive the color pixels, respectively. Each of the color pixel circuits includes a drive transistor having an active layer and a gate electrode. Sizes of the color pixel circuits are set unevenly within the pixel circuit according to an area ratio between overlapping regions, each defined as a region where the active layer and the gate electrode in the drive transistor overlap one another.

According to an embodiment of the invention, there is provided a second electronic device including the foregoing second self-light emitting display unit having a display function.

In the second self-light emitting display unit and the second electronic device of the embodiments of the invention, sizes of the color pixel circuits are set unevenly within the pixel circuit according to an area ratio between overlapping regions, each defined as a region where the active layer and the gate electrode in the drive transistor overlap one another. Thereby, even if device sizes of the drive transistors are different from each other according to the area between overlapping regions, in the respective pixels for each color, the pixel pattern densities in the corresponding pixel circuits are even to each other. Thereby, increase of the pattern defect rate due to increase of the pixel pattern density in the pixel circuit for a specific color is avoided, and the pattern defect rate as the whole pixel circuit is decreased.

According to an embodiment of the invention, there is provided a third self-light emitting display unit including a pixel layer in which a plurality of pixels are formed, each of the pixels being configured of a plurality of color pixels each having a color self-light emitting element; and a pixel circuit layer in which a plurality of pixel circuits are formed, each of the pixel circuits being configured of a plurality of color pixel circuits which drive the color pixels, respectively. Each of the color pixel circuits includes a capacitive element. Further, sizes of the color pixel circuits are set unevenly within the pixel circuit according to an area ratio between capacitive elements in the color pixel circuits.

According to an embodiment of the invention, there is provided a third electronic device including the foregoing third self-light emitting display unit having a display function.

In the third self-light emitting display unit and the third electronic device of the embodiments of the invention, sizes of the color pixel circuits are set unevenly within the pixel circuit according to an area ratio between capacitive elements in the color pixel circuits. Thereby, even if device sizes of the accumulated capacitative elements are different from each other according to the area of the accumulated capacitative element, in the respective pixels for each color, the pixel pattern densities in the corresponding pixel circuits are even to each other. Thereby, increase of the pattern defect rate due to increase of the pixel pattern density in the pixel circuit for a specific color is avoided, and the pattern defect rate as the whole pixel circuit is decreased.

According to the first self-light emitting display unit or the first electronic device of the embodiments of the invention, sizes of the color pixel circuits are set unevenly within the pixel circuit according to a magnitude ratio of drive currents which allow the color self-light emitting elements in the pixel to emit with a same light emission luminance. Thereby, the pixel pattern densities of the corresponding pixel circuits in each pixel for each color become even to each other, and the pattern defect rate as the whole pixel circuit is able to be decreased. Accordingly, the manufacturing yield is able to be improved.

According to the second self-light emitting display unit and the second electronic device of the embodiments of the invention, sizes of the color pixel circuits are set unevenly within the pixel circuit according to an area ratio between overlapping regions, each defined as a region where an active layer and a gate electrode in the drive transistor overlap one another. Thus, the pixel pattern densities in the corresponding pixel circuits in each pixel for each color become even to each other, and the pattern defect rate as the whole pixel circuit is able to be decreased. Accordingly, the manufacturing yield is able to be improved.

According to the third self-light emitting display unit and the third electronic device of the embodiments of the invention, sizes of the color pixel circuits are set unevenly within the pixel circuit according to an area ratio between capacitive elements in the color pixel circuits. Thus, the pixel pattern densities in the corresponding pixel circuits in each pixel for each color are even to each other, and the pattern defect rate as the whole pixel circuit is able to be decreased. Accordingly, the manufacturing yield is able to be improved.

Other and further objects, features and advantages of the invention will appear more fully from the following description.

DETAILED DESCRIPTION OF THE PREFERRED EMBODIMENTS

Embodiments of the invention will be hereinafter described in detail with reference to the drawings.

First Embodiment

Figure 1:
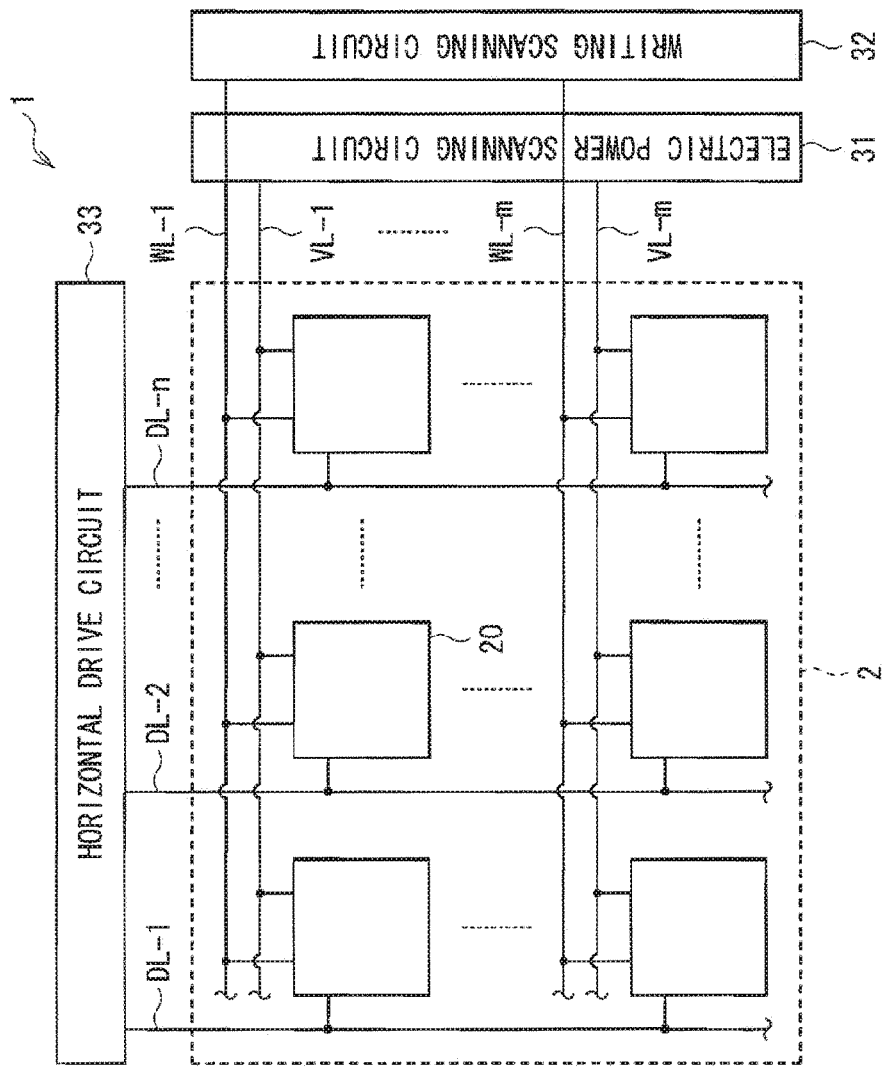
FIG. 1 is a block diagram illustrating a whole structure of a self-light emitting display unit according to a first embodiment of the invention.

FIG. 1 illustrates an overall structure of a self-light emitting display unit (organic EL display unit 1) according to a first embodiment of the invention. The organic EL display unit 1 includes a pixel array section 2 having pixels 20 that are two-dimensionally arranged in the state of a matrix, and an electric power scanning circuit 31, a writing scanning circuit 32, and a horizontal drive circuit 33 that are arranged on the periphery of the pixel array section 2. In the m*n pixel arrangement of the pixel array section 2, electric power supply lines VL-1 to VL-m and scanning lines WL-1 to WL-m are connected to pixels for every pixel row, and signal lines DL-1 to DL-n are connected to pixels for every pixel column.

The pixel array section 2 is formed on a transparent insulated substrate (not illustrated) made of, for example, a glass plate or the like, and has a flat type panel structure. In each pixel 20 in the pixel array section 2, as described later, a pixel circuit using an amorphous silicon TFT (Thin Film Transistor) or a low temperature polysilicon TFT is formed. In the pixel circuit, as described later, an organic EL device as a self-light emitting device and a pixel circuit layer composed of a metal layer, a semiconductor layer, an insulating layer and the like are included. In the case where the low temperature polysilicon TFT is used in the pixel circuit, the electric power scanning circuit 31, the writing scanning circuit 32, and the horizontal drive circuit 33 are also able to be mounted on the panel (substrate) on which the pixel array section 2 is formed.

The writing scanning circuit 32 is a circuit for line-sequentially scanning the pixel 20 in units of row by line-sequentially supplying a scanning signal to the scanning lines WL-1 to WL-m.

The electric power scanning circuit 31 is a circuit for supplying an electric power voltage to the electric power supply lines VL-1 to VL-m being synchronized with the line sequential scanning by the writing scanning circuit 32.

The horizontal drive circuit 33 is a circuit for supplying as appropriate a display drive voltage based on a picture signal according to luminance information (specifically, a signal potential (after-mentioned signal potential Vsig) and a reference potential (after-mentioned reference potential Vo)) to the signal lines DL-1 to DL-n.

Figure 2:
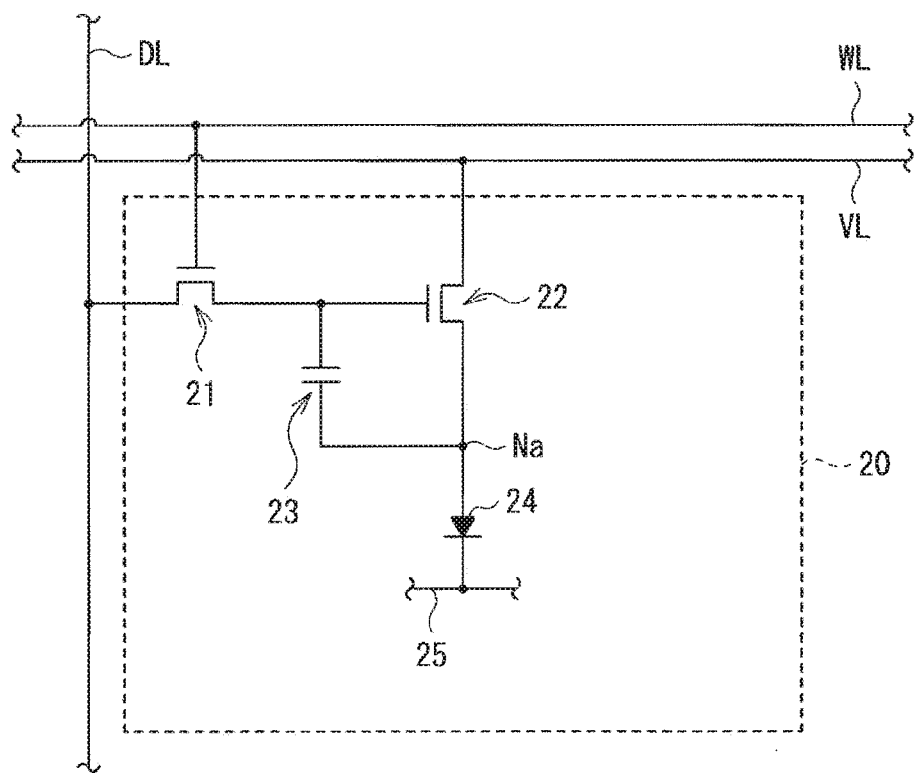
FIG. 2 is a circuit diagram illustrating a structural example of a pixel circuit in each pixel illustrated in FIG. 1.

FIG. 2 is a circuit diagram illustrating a structural example of the pixel circuit formed in each pixel 20. The pixel circuit includes a writing transistor 21, a drive transistor 22, an accumulated capacitative element 23, and an organic EL device 24. The electric power supply line VL, the scanning line WL, and the signal line DL are connected to the pixel circuit. The writing transistor 21 and the drive transistor 22 are respectively configured of an N-channel type TFT. Conductivity type combination of the writing transistor 21 and the drive transistor 22 is not limited thereto, but other combination may be adopted.

In the writing transistor 21, a gate is connected to a scanning line WL, a source is connected to a signal line DL, and a drain is connected to a gate of the drive transistor 22 and one end of an accumulated capacitative element 23. The writing transistor 21 becomes in the state of conduction according to the scanning signal applied from the writing scanning circuit 32 to the gate through the scanning line WL, and thereby samples the signal potential Vsig of the picture signal supplied from the horizontal drive circuit 33 through the signal line DL and writes the signal potential into the pixel 20. The written signal potential Vsig (display drive current) is retained in the accumulated capacitative element 23.

In the drive transistor 22, a source is connected to the other end of the accumulated capacitative element 23 and an anode (anode electrode) of the organic EL device 24, and a drain is connected to the power source supply line VL. In the case where the potential of the electric power supply line VL is in the state of "H (high)," the drive transistor 22 is supplied with a current through the electric power supply line VL. Thereby, the drive transistor 22 supplies the display drive current according to the signal potential Vsig retained in the accumulated capacitative element 23 to the organic EL device 24, and current-drives the organic EL device 24.

The accumulated capacitative element 23 accumulates the display drive current as described above.

In the organic EL device 24, a cathode (cathode electrode) is connected to a common electric power supply line 25 commonly connected to all pixels 20.

A description will be given in detail of planar structural examples and a cross sectional structural example of the pixel circuit illustrated in FIG. 2 with reference to FIG. 3 to FIG. 6.

Figure 3:
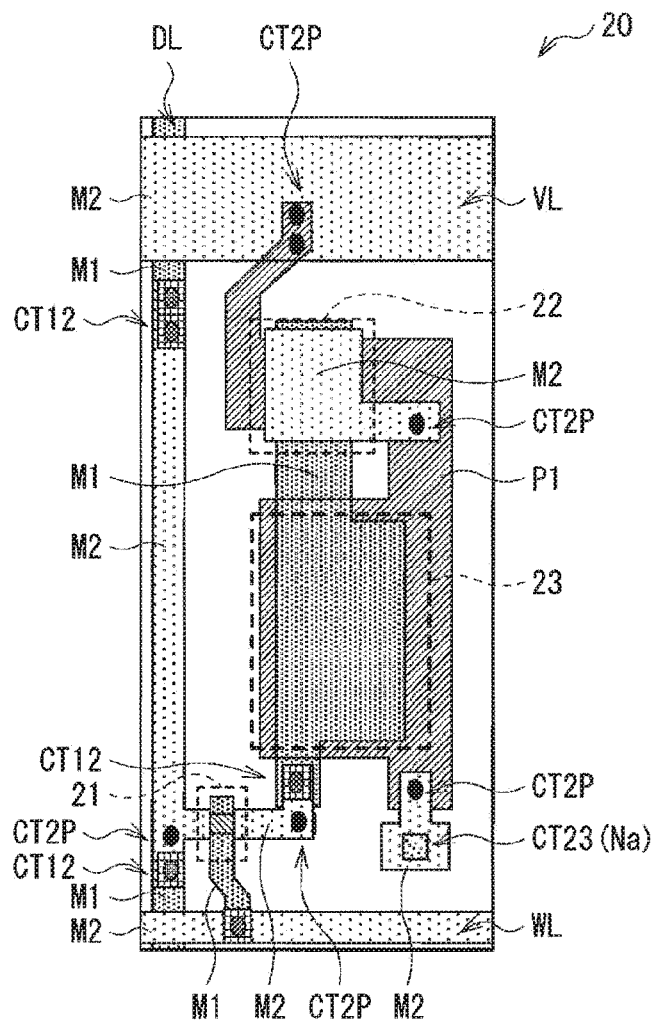
FIG. 3 is a plan view illustrating a structure of the pixel circuit illustrated in FIG. 2.

FIG. 3 illustrates a planar structural example of a pixel circuit (pixel circuit layer) in one pixel 20. The pixel circuit has a laminated structure in which, a first metal layer M1, a polysilicon layer P1, and a second metal layer M2 are respectively layered with an insulating layer (not illustrated) (composed of, for example, silicon oxide ($SiO_2$) or the like) in between in this order from the substrate side (not illustrated). The first metal layer M1 and the second metal layer M2 are respectively composed of, for example, aluminum (Al), copper (Cu) or the like. The first metal layer M1 and the second metal layer M2 are electrically connected with a connection contact section CT 12 in between. The second metal layer M2 and the polysilicon layer P1 are electrically connected with a connection contact section CT 2P in between.

Specifically, the signal line DL is configured of the first metal layer M1 and the second metal layer M2. The electric power supply line VL and the scanning line WL are respectively configured of the second metal layer M2.

The writing transistor 21 and the drive transistor 22 are respectively configured of the first metal layer M1, the second metal layer M2, the polysilicon layer P1, and the insulating layer (not illustrated). The accumulated capacitative element 23 is configured of the first metal layer M1, the polysilicon layer P1, and the insulating layer (not illustrated).

The organic EL device 24 is connected to the pixel circuit layer illustrated in FIG. 3 through a connection contact section CT23 structuring a node Na.

Figure 4:
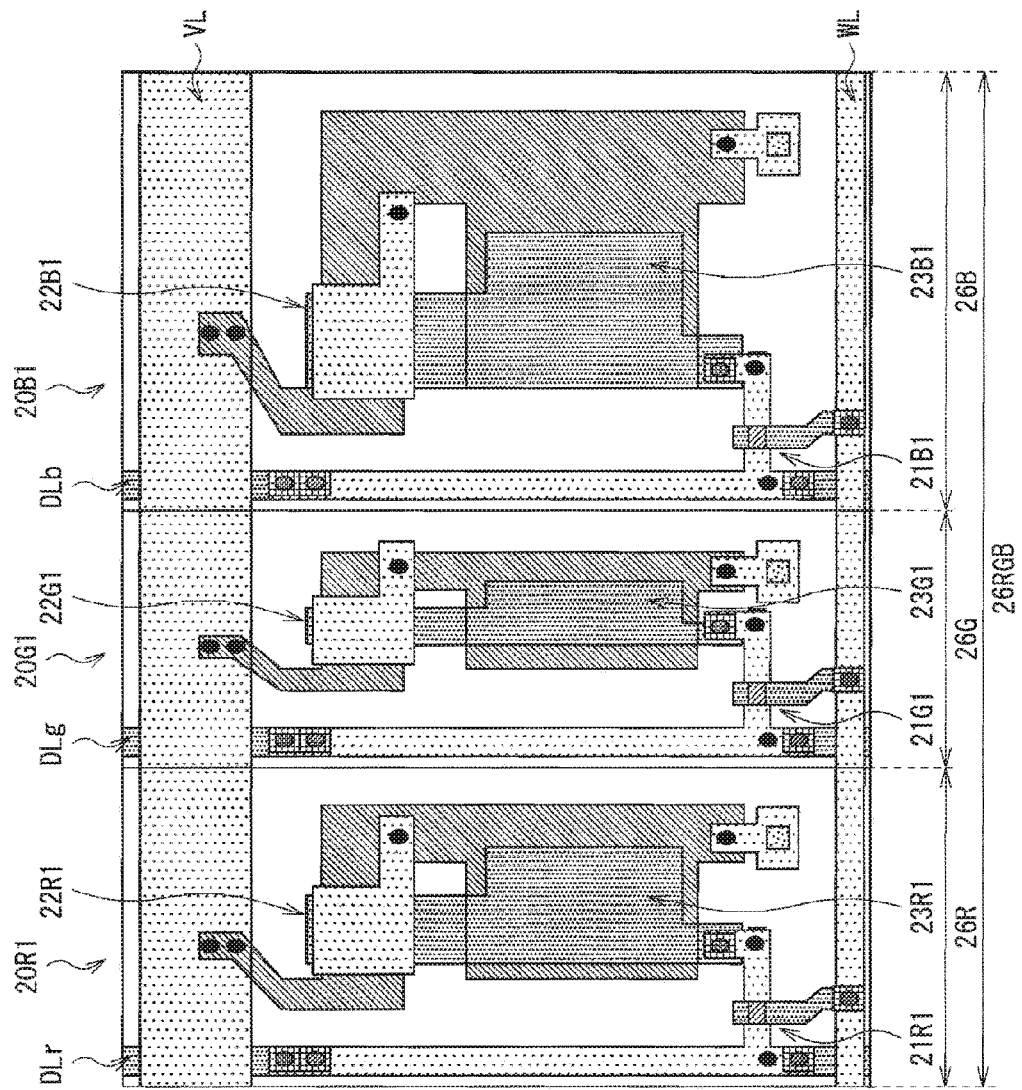
FIG. 4 is a plan view illustrating a structural example of a pixel circuit layer of a pixel for each color according to the first embodiment.

FIG. 4 illustrates a planar structural example of a pixel circuit (pixel circuit layer) of pixels for each color 20R1, 20G1, and 20B1. In the figure, the red pixel 20R1, the green pixel 20G1, and the blue pixel 20B1 are arranged in this order along the electric power supply line VL and the scanning line WL. That is, the pixel 20 is configured of the pixels 20R1, 20G1, and 20B1 for R (red), G (green), and B (blue). Signal line (signal lines DLr, DLg, and DLb) for supplying the display drive voltage based on the picture signal are respectively connected for every pixel 20R1, 20G1, and 20B1 for R, G, and B.

In the red pixel 20R1, as illustrated in FIG. 3, a writing transistor 21R1, a drive transistor 22R1, an accumulated capacitative element 23R1 and the like are formed. The electric power supply line VL, the scanning line WL, and the signal line DLr are connected to the red pixel 20R1. Similarly, in the green pixel 20G1, a writing transistor 21G1, a drive transistor 22G1, and an accumulated capacitative element 23G1 and the like are formed. The electric power supply line VL, the scanning line WL, and the signal line DLg are connected to the green pixel 20G1. Further, in the blue pixel 20B1, a writing transistor 21B1, a drive transistor 22B1, an accumulated capacitative element 23B1 and the like are formed. The electric power supply line VL, the scanning line WL, and the signal line DLb are connected to the blue pixel 20B1.

In the pixel circuit layer of this embodiment, sizes of the color pixel circuits 26R, 26G and 26B corresponding to the pixels 20R1, 20G1, and 20B1 for R, and B are respectively set unevenly within the pixel circuit according to a ratio of a size of the display drive current necessary for each organic EL device 24 to obtain the same light emission luminance. Specifically, sizes of the color pixel circuits 26R, 26G and 26B are respectively set unevenly within the pixel circuit according to an area ratio between the color pixel circuits, of opposing regions (overlapping regions) of an active layer (polysilicon layer P1) and a gate electrode (second metal layer M2) in the drive transistors 22R1, 22G1, and 22B1 in the pixel circuits. Further, sizes of the color pixel circuits 26R, 26G, and 26B are set unevenly within the pixel circuit according to an area ratio between the color pixel circuits, of the accumulated capacitative elements 23R1, 23G1, and 23B1. However, the total pixel size of the red pixel 20R, the green pixel 206, and the blue pixel 20B (total pixel size 26RGB: for example, about 100 μm) is set to be the same as an existing total pixel size.

Sizes of the color pixel circuits 26R, 26G and 26B are expressed by the following expression 1:

(the pixel size 26G corresponding to the pixel 20G1 for G)<(the pixel size 26R corresponding to the pixel 20R1 for R)<(the pixel size 26B corresponding to the pixel 20B1 for B)  1

Figure 5:
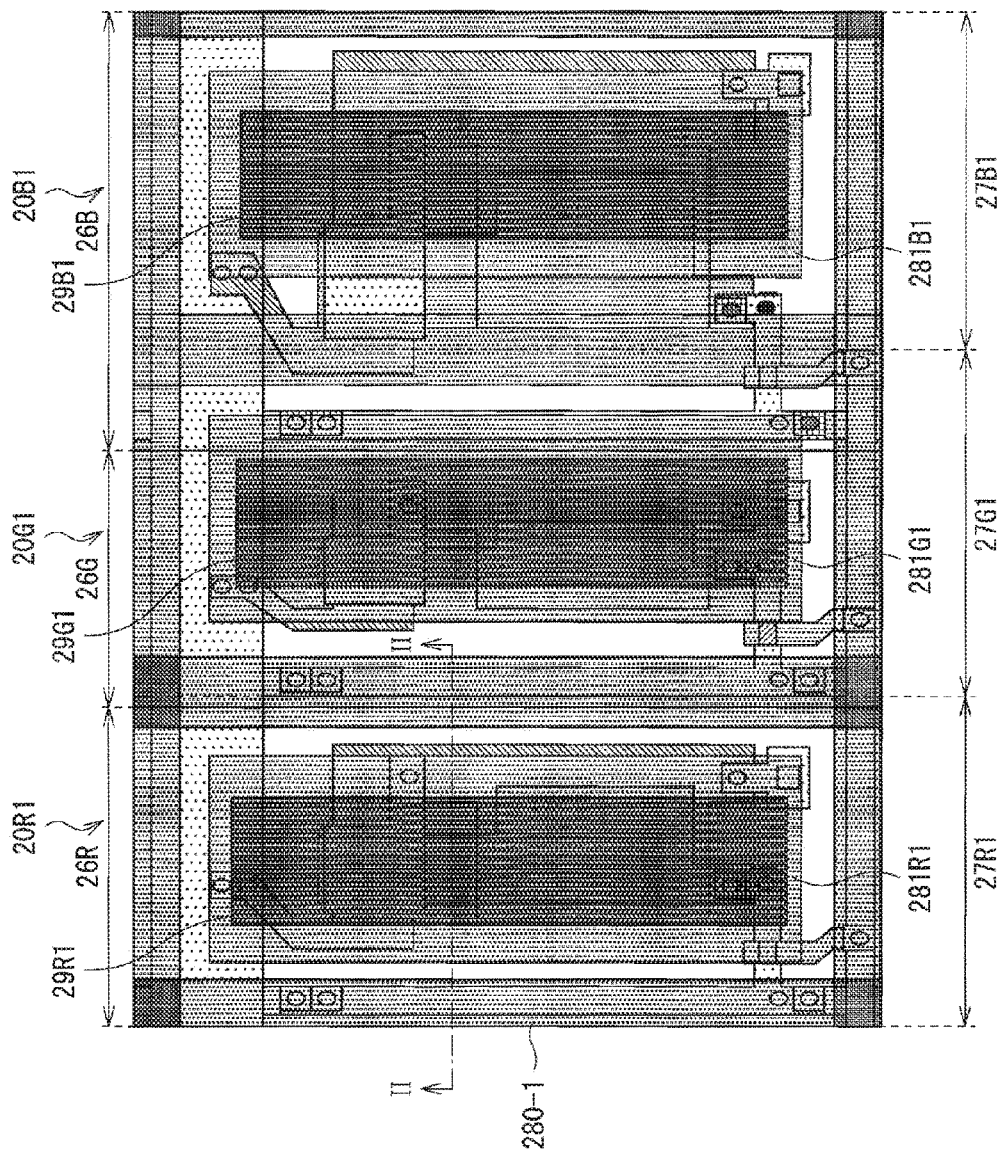
FIG. 5 is a plan view illustrating a structural example of a self-light emitting device of a pixel for each color according to the first embodiment.

In the pixel layer of this embodiment, as a planar structural example illustrated in FIG. 5, respective sizes 27R1, 27G1, and 27B1 of pixels 20R1, 20G1, and 20B1 for R, G, and B are set evenly within the pixel, and formation positions of pixels 20R1, 20G1, and 20B1 for R, G, and B are set evenly within the pixel. Specifically, arrangement pitches of anode electrodes 281R1, 281G1, and 281B1 and light emitting layers 29R1, 29G1, and 29B1 are respectively set evenly within the pixel, and formation positions of anode electrodes 281R1, 281G1, and 281B1 and light emitting layers 29R1, 29G1, and 29B1 are respectively set evenly within the pixel. More specifically, arrangement pitches of anode electrodes 281R1, 281G1, and 281B1 are respectively set evenly within the pixel, and formation positions of anode electrodes 281R1, 281G1, and 281B1, and further, arrangement pitches of light emitting layers 29R1, 29G1, and 29B1 are respectively set evenly within the pixel, and formation positions of light emitting layers 29R1, 29G1, and 29B1 are respectively set evenly within the pixel. The anode electrodes 281R1, 281G1, and 281B1 are, for example, configured of an electrode in which ITO (indium tin complex oxide) is layered on silver (Ag) or an Ag alloy.

Figure 6:
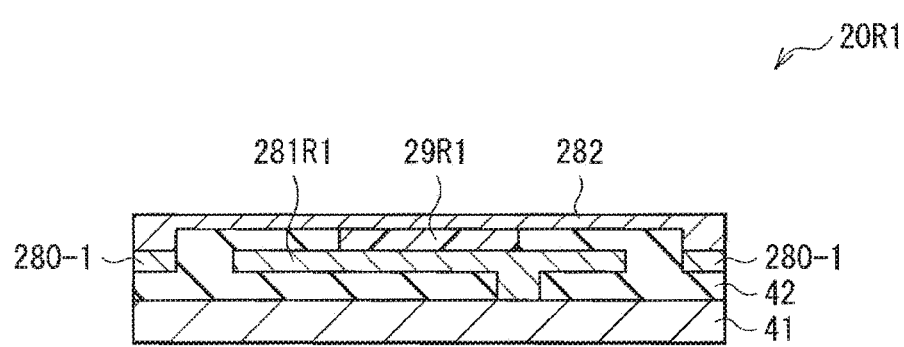
FIG. 6 is a cross sectional view illustrating a cross sectional structural example of the pixel circuit layer and the self-light emitting device illustrated in FIG. 4 and FIG. 5.

As illustrated in a cross sectional structural example of FIG. 6 (cross sectional structural example taken along II-II in FIG. 5), the organic EL device 24 has a laminated structure including the anode electrode 281R1 and the like, the light emitting layer 29R1 and the like, a cathode electrode 282 common to each pixel, an auxiliary electrode section 280-1 electrically connected to the cathode electrode 282, and an insulating layer 42, and is formed on a pixel circuit layer 41. The cathode electrode 282 is configured of a single substance or an alloy of a metal element such as aluminum (Al), magnesium (Mg), calcium (Ca), and sodium (Na).

Next, a description will be given in detail of operations and effects of the organic EL display unit 1 of this embodiment.

Figure 7:
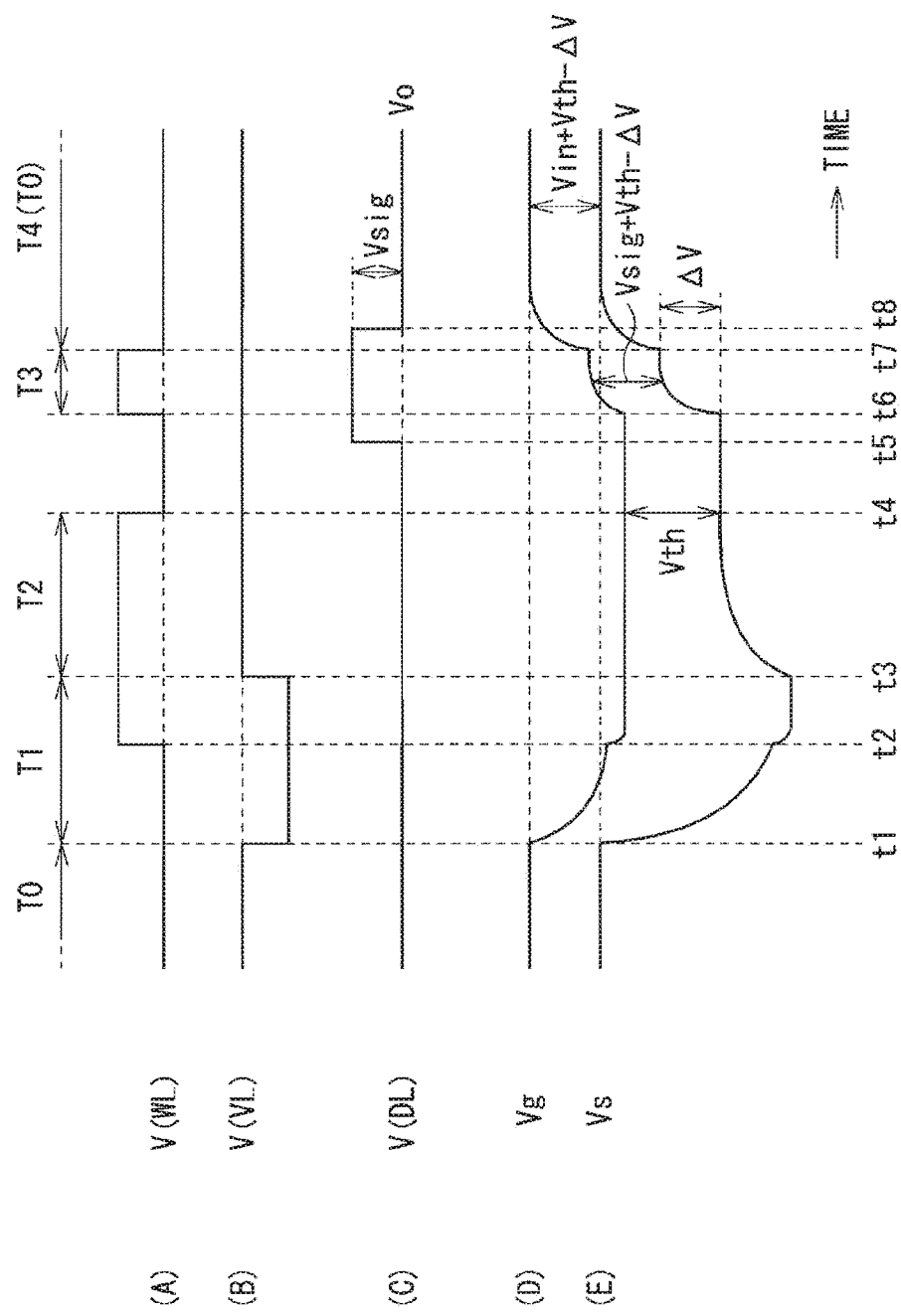
FIG. 7 is a timing waveform chart illustrating a display drive operation example in the pixel circuit illustrated in FIG. 2.

First, a description will be given of a basic operation of the organic EL display unit 1 (operation of display-driving the pixel circuit of each pixel 20) with reference to FIG. 7 in addition to FIG. 2. FIG. 7 is a timing waveform chart illustrating a display drive operation example in the pixel circuit illustrated in FIG. 2. In FIG. 7, (A) illustrates a scanning line potential V (WL), (B) illustrates an electric power supply line potential V (VL), (C) illustrates a signal line potential V (DL), (D) illustrates a gate potential Vg of the drive transistor 22, and (E) illustrates a source potential Vs of the drive transistor 22.

Light Emission Time Period T0

First, in light emission time period T0 before timing t1, the organic EL device 24 is in the state of light emission (light emission time period). In the light emission time period T0, the potential V (VL) of the electric power supply line VL is in the state of high potential ("H" state), and a display drive current (drain-to-source current) is supplied from the electric power supply line VL to the organic EL device 24 through the drive transistor 22. Thus, the organic EL device 24 emits light at luminance according to the display drive current.

Threshold Value Correction Preparatory Time Period T1

Next, in the timing t1, the state becomes a new field of line sequential scanning. At this time, the potential V (VL) of the electric power supply line VL is shifted from a high potential to a potential sufficiently lower than the reference potential Vo of the signal line DL ("L (low)" state), and the source potential Vs of the drive transistor 22 becomes a potential almost even to this low potential.

Next, in timing t2, the scanning signal is outputted from the writing scanning circuit 32, and the potential of the scanning line DL is shifted to the high potential side. Thereby, the writing transistor 21 becomes in the state of conduction. At this time, since the reference potential Vo is supplied from the horizontal drive circuit 33 to the signal line DL, the gate potential Vg of the drive transistor 22 becomes the reference potential Vo. At this time, the source potential Vs of the drive transistor 22 is a potential sufficiently lower than the reference potential Vo.

The low potential is set so that a gate-to-source voltage Vgs of the drive transistor 22 is larger than a threshold value voltage Vth of the drive transistor 22. As described above, respective initialization is performed so that the gate potential Vg of the drive transistor 22 becomes the reference potential Vo and the source potential Vs becomes the low potential, and thereby preparation of the threshold value voltage correction operation is completed.

Threshold Value Correction Time Period T2

Next, in timing t3, the potential V (VL) of the electric power supply line VL is shifted from low potential to high potential. The source potential Vs of the drive transistor 22 starts to be increased. In due course of time, the gate-to-source voltage Vgs of the drive transistor 22 becomes the threshold value voltage Vth of the drive transistor 22. A voltage corresponding to the threshold value voltage Vth is written in the accumulated capacitative element 23.

For convenience, time period during which the voltage corresponding to the threshold value voltage Vth is written in the accumulated capacitative element 23 is called threshold value correction time period T2. In the threshold value correction time period T2, to make a current only flow to the accumulated capacitative element 23 side and prevent the current from being flown to the organic EL device 24 side, the potential of the common electric power supply line 25 is set so that the organic EL device 24 becomes in the state of cutoff.

Sampling Time Period/Mobility Correction Time Period T3

Next, in timing t4, output of the scanning signal from the writing scanning circuit 32 is stopped, and the potential V (WL) of the scanning line WL is shifted to the low potential side. Thereby, the writing transistor 21 becomes in the state of non-conduction. At this time, the gate of the drive transistor 22 becomes in the state of floating. However, since the gate-to-source voltage Vgs is even to the threshold value voltage Vth of the drive transistor 22, the drive transistor 22 is in the state of cutoff. Thus, the drain-to-source current is not flown.

Next, in timing t5, the potential V (DL) of the signal line DL is shifted from the reference potential Vo to the signal potential Vsig of the picture signal. In timing t6, the scanning signal is again outputted from the writing scanning circuit 32, and the potential V (WL) of the scanning line WL is shifted to the high potential side. Thereby, the writing transistor 21 becomes in the state of conduction, and the signal potential Vsig of the picture signal is sampled.

Due to sampling of the signal potential Vsig by the writing transistor 21, the gate potential Vg of the drive transistor 22 becomes the signal potential Vsig. At this time, since the organic EL device 24 is firstly in the state of cutoff (high impedance state). Thus, the drain-to-source current of the drive transistor 22 is flown into a parasitic capacitative element (not illustrated) connected in parallel to the organic EL device 24, and charging the parasitic capacitative element is started.

Due to charging the parasitic capacitative element, the source potential Vs of the drive transistor 22 starts to be increased. In due course of time, the gate-to-source voltage Vgs of the drive transistor 22 becomes (Vsig+Vth−ΔV). That is, the increase portion ΔV of the source potential Vs is deducted from the voltage retained in the accumulated capacitative element 23 (Vsig+Vth), that is, the increase portion ΔV of the source potential Vs acts to discharge the electric charge of the accumulated capacitative element 23, resulting in the state of negative feedback. Thus, the increase portion ΔV of the source potential Vs becomes a feedback amount of negative feedback.

As described above, the drain-to-source current flowing through the drive transistor 22 is negatively feed-backed to gate input of the drive transistor 22, that is, the gate-to-source voltage Vgs, and thereby mobility correction in which dependability on mobility μ of the drain-to-source current of the drive transistor 22 is negated, that is, mobility correction in which variation of the mobility μ for every pixel is corrected is performed.

More specifically, as the signal potential Vsig of the picture signal is increased, the drain-to-source current is increased, and the absolute value of the feedback amount of negative feedback (correction amount) ΔV is increased as well. Thus, mobility correction according to light emission luminance level is able to be performed. Further, in the case where the signal potential Vsig of the picture signal is constant, as the mobility μ of the drive transistor 22 is increased, the absolute value of the feedback amount of negative feedback ΔV is increased as well, and thus variation of the mobility N, for every pixel is negated.

Light Emission Time Period T4 (T0)

Next, in timing t7, output of the scanning signal from the writing scanning circuit 32 is stopped, and the potential V (WL) of the scanning line WL is shifted to the low potential side. Thereby, the writing transistor 21 becomes in the state of non-conduction. Thereby, the gate of the drive transistor 22 is detached from the signal line DL. At the same time, a drain-to-source current starts to flow in the organic EL device 24, and thereby the anode potential of the organic EL device 24 is increased according to the drain-to-source current.

Such increase of the anode potential of the organic EL device 24 is precisely increase of the source potential Vs of the drive transistor 22. Therefore, in the case where the source potential Vs of the drive transistor 22 is increased, due to boot strap operation of the accumulated capacitative element 23, the gate potential Vg of the drive transistor 22 is increased in conjunction therewith. At this time, the increase amount of the gate potential Vg is even to the increase amount of the source potential Vs. Thus, in light emission time period T4, the gate-to-source voltage Vgs of the drive transistor 22 is constantly maintained as (Vin+Vth−ΔV).

Display-driving the pixel circuit in each pixel 20 described above is line-sequentially performed in the pixel array section 2, and thereby image display based on the picture signal is performed as the whole organic EL display unit 1 illustrated in FIG. 1.

Figure 8:
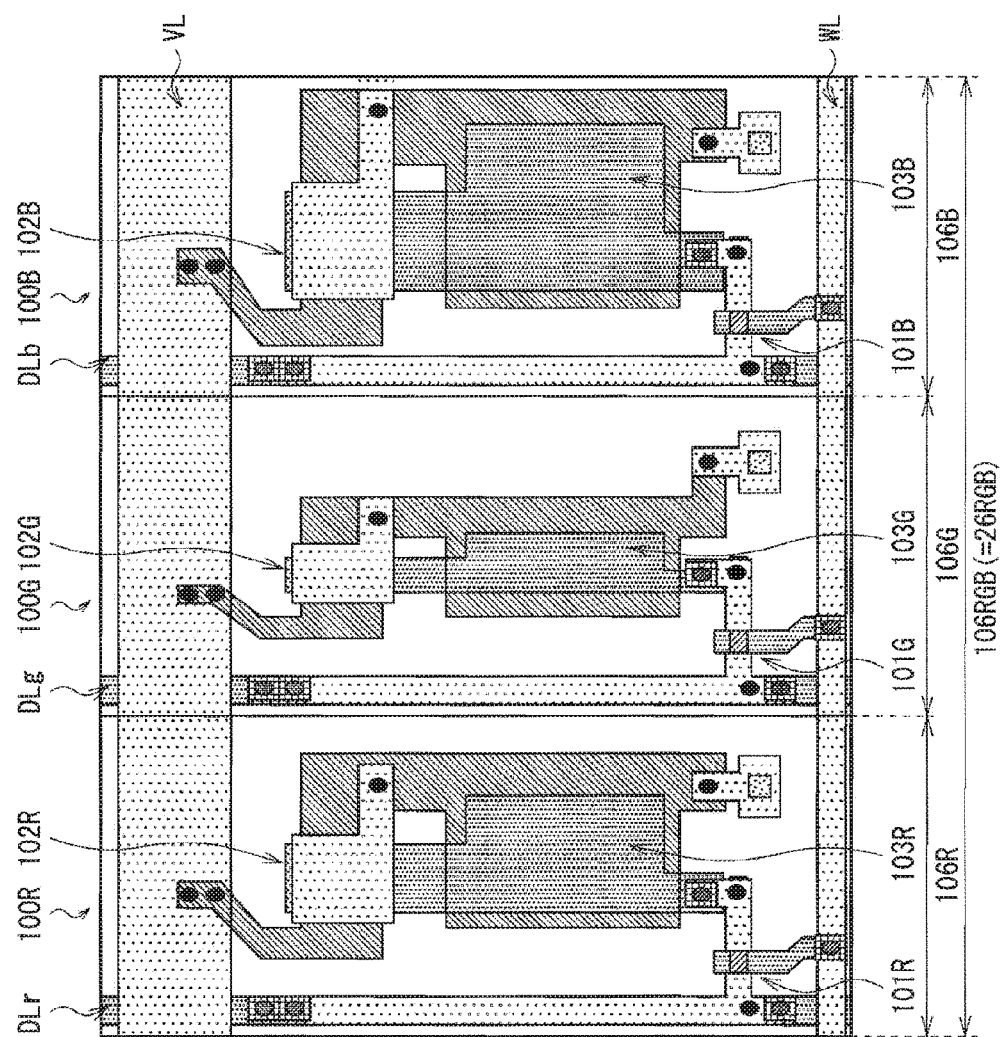
FIG. 8 is a plan view illustrating an existing structure of a pixel circuit layer of a pixel for each color according to a comparative example.
Figure 9:
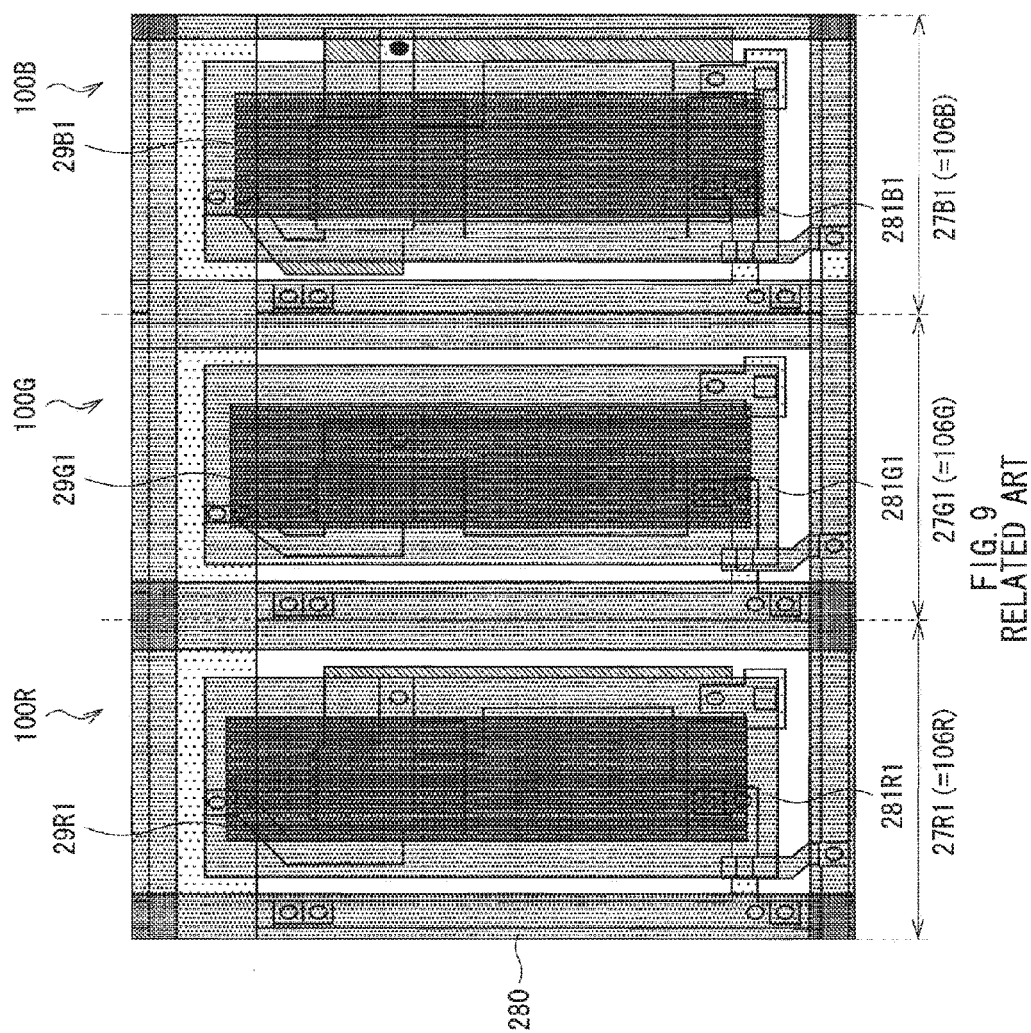
FIG. 9 is a plan view illustrating an existing structure of a self-light emitting device of a pixel for each color according to the comparative example.

Next, a description will be given in detail of operations and effects of characteristic sections of the invention with reference to FIG. 8 and FIG. 9 in addition to FIG. 4 and FIG. 5 in comparison with a comparative example. FIG. 8 and FIG. 9 illustrate planar structural examples of a pixel circuit layer and an organic EL device of pixels for each color 100R, 100G, and 100B in an existing organic EL display unit according to the comparative example. In the red pixel 100R, a writing transistor 101R, a drive transistor 102R, an accumulated capacitative element 103R and the like are formed. The electric power supply line VL, the scanning line WL, and the signal line DLr are connected to the red pixel 100R. Similarly, in the green pixel 100G, a writing transistor 101G, a drive transistor 102G, an accumulated capacitative element 103G and the like are formed. The electric power supply line VL, the scanning line WL, and the signal line DLg are connected to the green pixel 100G. Further, in the blue pixel 100B, a writing transistor 101B, a drive transistor 102B, an accumulated capacitative element 103B and the like are formed. The electric power supply line VL, the scanning line WL, and the signal line DLb are connected to the blue pixel 100B.

As illustrated in FIG. 8, in the organic EL display unit according to the comparative example, sizes of the color pixel circuits 106R, 106G, and 106B respectively corresponding to the pixels 100R, 100G, and 100B for R, G, and B are respectively set evenly within the pixel circuit. Further, sizes of the drive transistors 102R, 102G, and 102B and sizes of the accumulated capacitative elements 103R, 103G, and 103B are different from each other according to sizes of a display drive current necessary for the respective organic EL devices 24 to obtain the same light emission luminance.

Thereby, in a pixel circuit for specific color (in this case, in particular, the blue color pixel 100B), the pixel pattern density is increased, and thus the pattern defect rate is increased due to dust or the like. Therefore, since the pattern defect rate is increased, the manufacturing yield is lowered.

The pixel configured of the pixels 100R, 1000 and 100B for R, and B has, for example, a planar structure as shown in FIG. 9. That is, in the same manner as that of FIG. 5 of this embodiment, respective sizes 27R1, 27G1, and 27B1 of the pixels 100R, 100G and 100B for R, G, and B are respectively set evenly within the pixel, and formation positions of the pixels 100R, 100G and 100B for R, and B are respectively set evenly within the pixel.

Meanwhile, in the organic EL display unit 1 of this embodiment, as illustrated in FIG. 4, sizes of the color pixel circuits 26R, 26G, and 26B respectively corresponding to the pixels 20R1, 20G1, and 20B1 for R, G, and B are respectively set unevenly within the pixel circuit according to the ratio of the size of the display drive current necessary for each organic EL device 24 to obtain the same light emission luminance. Specifically, sizes of the color pixel circuits 26R, 26G and 26B are respectively set unevenly within the pixel circuit according to the area ratio between the color pixel circuits, of the opposing regions (overlapping regions) of the active layer (the polysilicon layer P1) and the gate electrode (the second metal layer M2) in the drive transistors 22R1, 22G1, and 22B1 in the pixel circuits. Further, sizes of the color pixel circuits 26R, 26G; and 26B are respectively set unevenly within the pixel circuit according to the area ratio between the color pixel circuits, of the accumulated capacitative elements 23R1, 23G1, and 23B1.

Thereby, the pattern densities of the color pixel circuits respectively corresponding to the pixels 20R1, 20G1, and 20B1 for R, and B become even to each other, even if the device sizes in the pixel circuits (specifically, the sizes of the drive transistors 22R1, 22G1, and 22B1 and the sizes of the accumulated capacitative elements 23R1, 23G1, and 23B1) are different from each other according to the size of the display drive current, the area of the foregoing opposing region, the area of the accumulated capacitative elements 23R1, 23G1, and 23B1 and the like. Thereby, increase of the pattern defect rate due to increase of the pixel pattern density in the pixel circuit for a specific color is avoided, and the pattern defect rate as the whole pixel circuit is decreased.

As described above, in this embodiment, sizes of the color pixel circuits 26R, 26G, and 26B respectively corresponding to the pixels 20R1, 20G1, and 20B1 for R, G, and B are respectively set unevenly within the pixel circuit according to the ratio of the size of the display drive current necessary for each organic EL device 24 to obtain the same light emission luminance. Thus, the pattern densities of the color pixel circuits respectively corresponding to the pixels 20R1, 20G1, and 20B1 for R, G, and B become even to each other, and the pattern defect rate as the whole pixel circuit is able to be decreased. Therefore, the manufacturing yield is able to be improved.

Specifically, sizes of the color pixel circuits 26R, 26G, and 26B are respectively set unevenly within the pixel circuit according to the area ratio between the color pixel circuits, of the opposing regions (overlapping regions) of the active layer (polysilicon layer P1) and the gate electrode (second metal layer M2) in the drive transistors 22R1, 22G1, and 22B1 in the pixel circuit. Thus, the foregoing effects are able to be obtained.

Further, sizes of the color pixel circuits 26R, 26G and 26B are respectively set unevenly within the pixel circuit according to the area ratio between the color pixel circuits, of the accumulated capacitative elements 23R1, 23G1, and 23B1. Thus, the foregoing effects are able to be obtained.

Further, respective sizes 27R1, 27G1, and 27B1 of the pixels 20R1, 20G1, and 20B1 for R, G, and B are respectively set evenly within the pixel, and the formation positions of the pixels 20R1, 20G1, and 20B1 for R, and B are set evenly within the pixel. Thus, existing patterns of the anode electrodes 281R1, 281G1, and 281B1 and the light emitting layers 29R1, 29G1, and 29B1 are able to be used directly without any modification. That is, while the characteristics of the luminance of the panel and the like of the existing pattern are maintained, the pattern defect rate as the whole pixel circuit is able to be decreased.

Several other embodiments of the invention will be hereinafter described. For the same elements as those in the foregoing first embodiment, the same referential symbols are affixed thereto, and the description will be omitted as appropriate.

Second Embodiment

Figure 10:
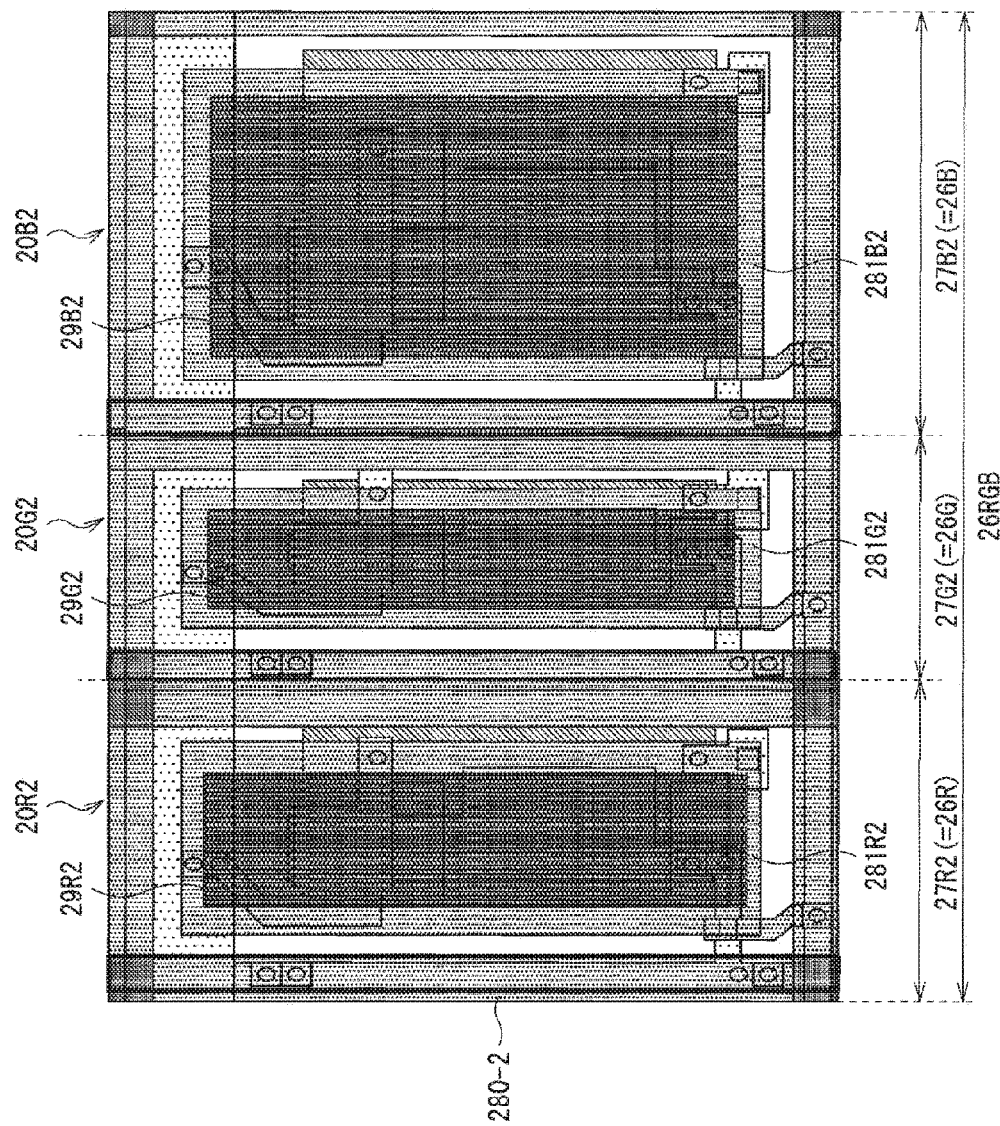
FIG. 10 is a plan view illustrating a structural example of a self-light emitting device of a pixel for each color according to a second embodiment.

FIG. 10 illustrates a planar structural example of a pixel circuit layer and organic EL devices of pixels for each color 20R2, 20G2, and 20B2 in a self-light emitting display unit (organic EL display unit) according to a second embodiment of the invention.

In the pixel circuit layer of this embodiment, in the same manner as that of the first embodiment, sizes of the color pixel circuits 26R, 26G and 26B respectively corresponding to the pixels 20R2, 20G2, and 20B2 for R, G, and B are respectively set unevenly within the pixel circuit according to a ratio between the color pixel circuits, of a size of the display drive current necessary for each organic EL device 24 to obtain the same light emission luminance, an area ratio between the color pixel circuits, of opposing regions between the polysilicon layer P1 and the second metal layer M2 in the drive transistors 22R1, 22G1, and 22B1 in the pixel circuit, or an area ratio between the color pixel circuits, of the accumulated capacitative elements 23R1, 23G1, and 23B1.

Further, in the organic EL device of this embodiment, differently from the first embodiment, respective sizes 27R2, 27G2, and 27B2 of the pixels 20R2, 20G2, and 20B2 for R, G, and B are set unevenly within the pixel according to a ratio of sizes of the color pixel circuits 26R, 26G, and 26B. Specifically, the arrangement pitches 27R2, 27G2, and 27B2 of anode electrodes 281R2, 281G2, and 281B2 are respectively set unevenly between the color pixel circuits according to sizes of the color pixel circuits 26R, 26G and 26B, and the arrangement pitches 27R2, 27G2, and 27B2 of light emitting layers 29R2, 29G2, and 29B2 are respectively set unevenly between the color pixel circuits according to sizes of the color pixel circuits 26R, 26G, and 26B.

Sizes of the color pixel circuits 26R, 26G, and 26B and sizes of the color pixels 27R2, 27G2, and 27B2 are expressed by the following expression 2 and expression 3:

size of G color pixel 27G2<size of R color pixel
  27R2<size of B color pixel 27B2                    2 size of G color pixel circuit 26G<size of R color
  pixel circuit 26R<size of B color pixel circuit
  26B                                                3

Next, a description will be given of operations and effects of the organic EL display unit of this embodiment with reference to FIG. 11 to FIG. 14 in addition to FIG. 10 in comparison with the organic EL display unit 1 of the foregoing first embodiment.

Figure 11:
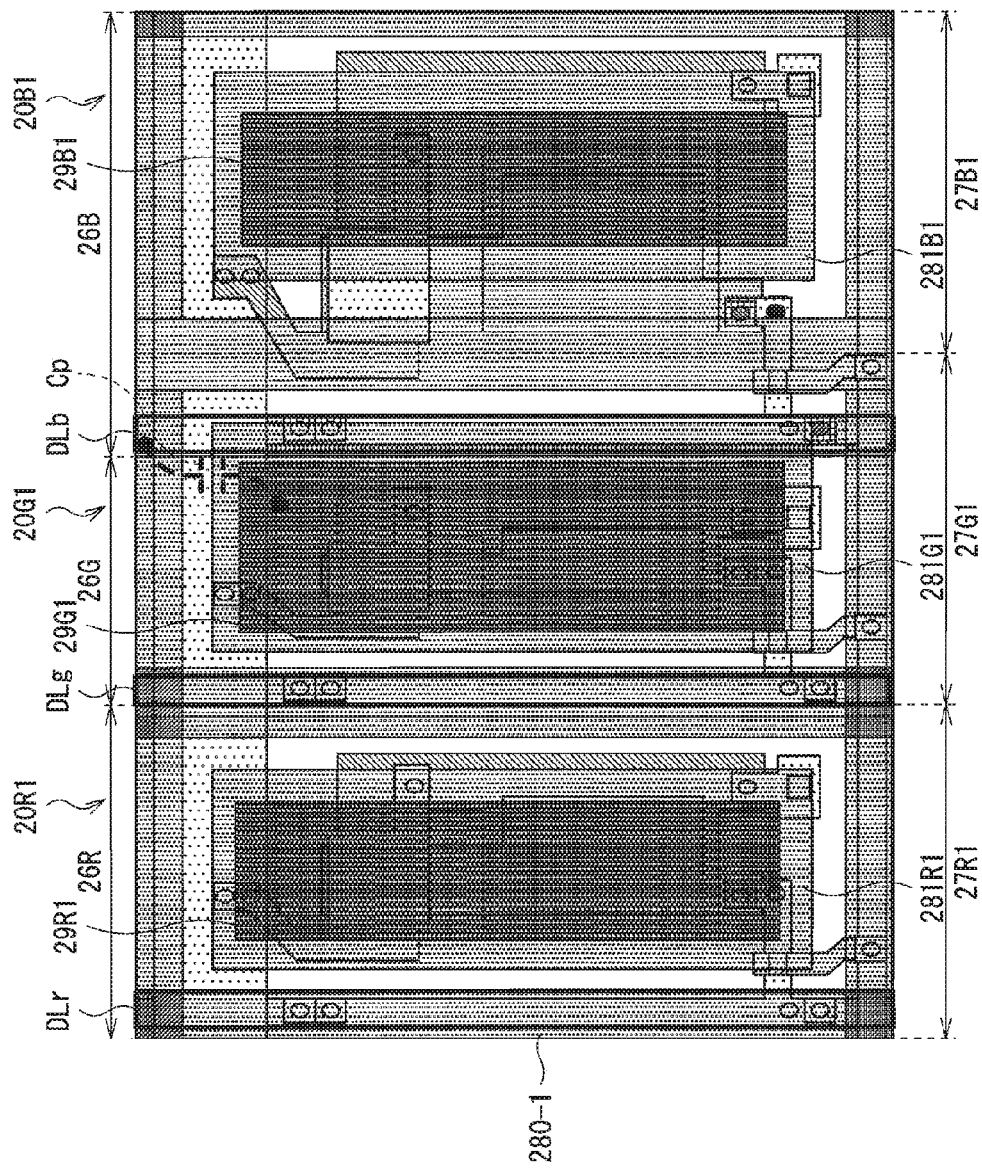
FIG. 11 is a plan view for explaining a parasitic capacity component that may be generated in the pixel circuit layer and the self-light emitting device of the first embodiment.

In the pixel circuit layer and the organic EL device 24 of the foregoing first embodiment, for example, as illustrated in FIG. 11, sizes 27R1, 27G1, and 27B1 of the color pixels 20R1, 20G1, and 20B1 for R, G, and B are set evenly within the pixel, and formation positions of the color pixels 20R1, 20G1, and 20B1 for R, and B are set evenly within the pixel. Thus, for example, as illustrated in the figure, in some cases, an anode electrode of one color pixel (in this case, the anode electrode 281R1 of the green pixel 20G1) and a signal line connected to a color pixel adjacent thereto (in this case, the signal line DLb connected to the blue pixel 20B1) are opposed to each other along the lamination direction (overlapped). In this case, a parasitic capacity component Cp is generated in between.

Figure 12A:
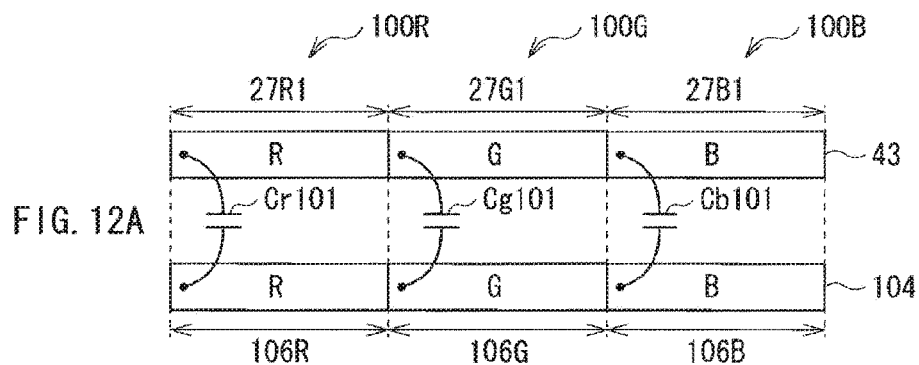
FIGS. 12A and 12B are schematic cross sectional views for explaining the parasitic capacity component illustrated in FIG. 11.
Figure 12B:
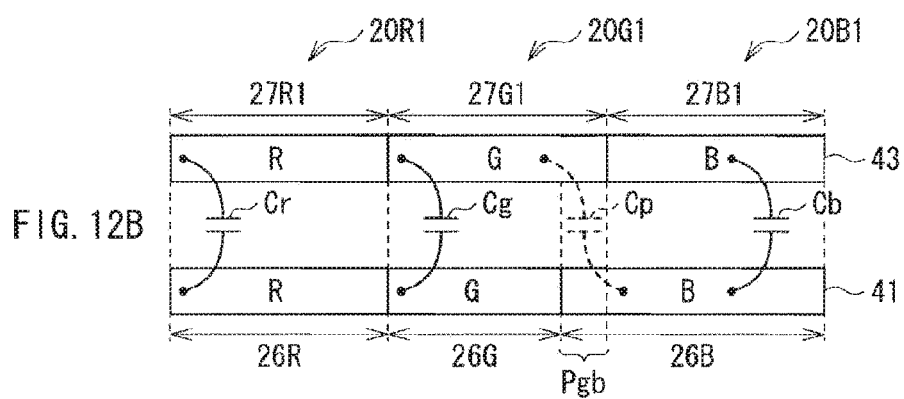
Figure 13:
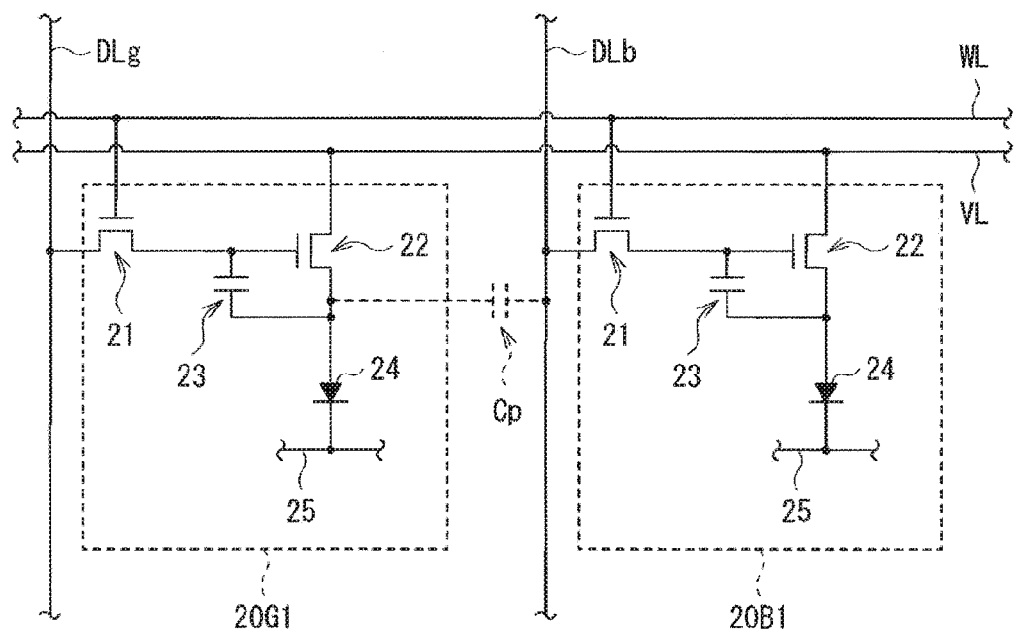
FIG. 13 is a circuit diagram for explaining the parasitic capacity component illustrated in FIG. 11.

That is, in the existing pixels 100R, 100G, and 100B, for example, as illustrated in a schematic cross sectional view in FIG. 12A, sizes (pitches) of the color pixel circuits 106R, 106G and 106B correspond with sizes (pitches) of the color pixels 27R1, 27G1, and 27B1. Thus, only inherent capacity components Cr101, Cg101, and Cb101 exist. Meanwhile, in the pixels 20R1, 20G1, and 20B1 of the foregoing first embodiment, for example, as illustrated in a schematic cross sectional view in FIG. 12B, sizes (pitches) of the color pixel circuits 26R, 26G, and 26B do not correspond with sizes (pitches) of the color pixels 27R1, 27G1, and 27B1. Thus, the parasitic capacity component Cp is generated in an overlapping region with an adjacent pixel. For example, FIG. 13 illustrates a circuit diagram illustrating such a parasitic capacity component Cp.

Figure 14:
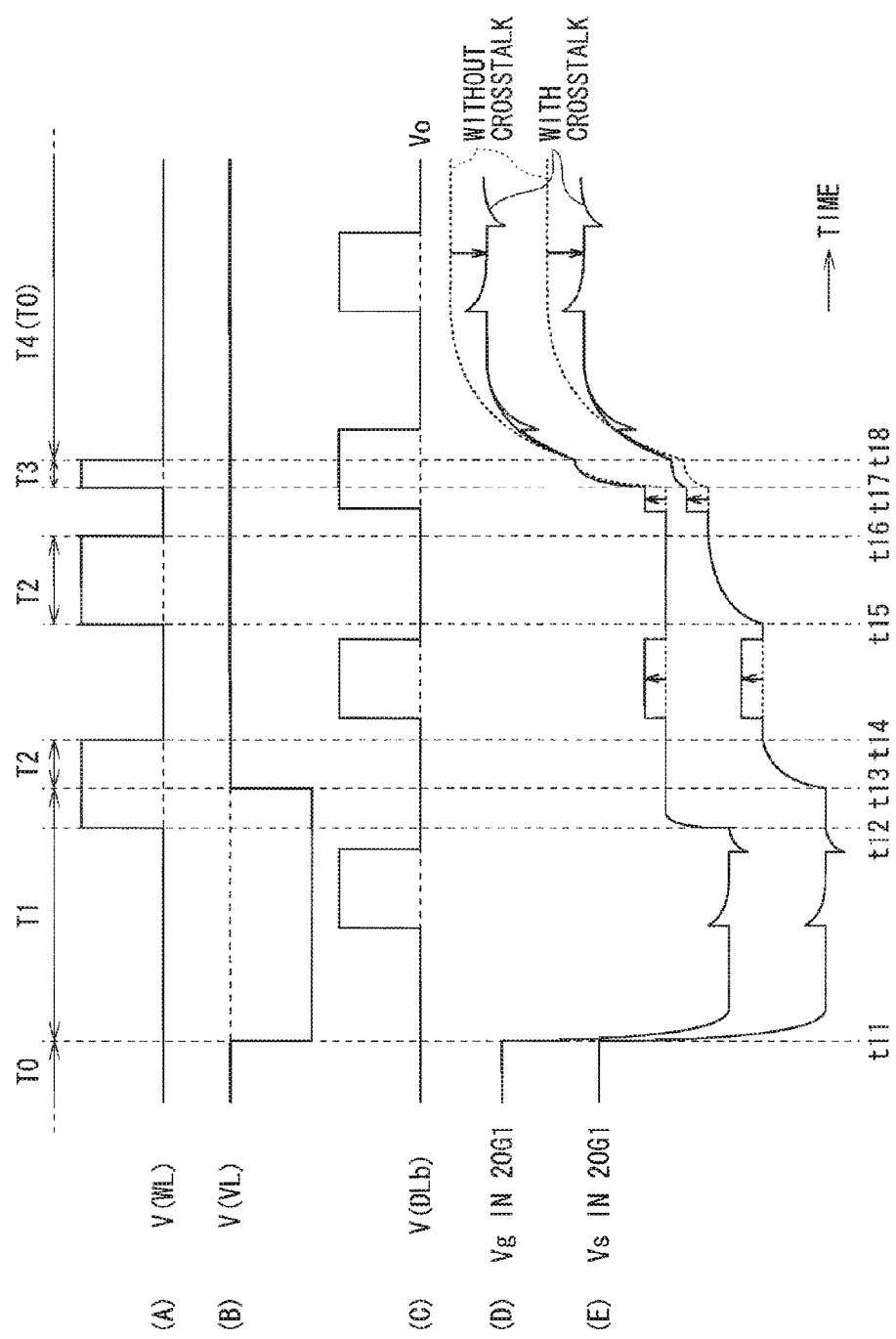
FIG. 14 is a timing waveform chart for explaining crosstalk phenomenon caused by the parasitic capacity component illustrated in FIG. 11.

In the case where such a parasitic capacity component Cp is generated, for example, as illustrated in a timing waveform chart (timings t11 to t18) in FIG. 14, in a signal line (in this case, signal line DLg) corresponding to the pixel emitting light (in this case, the green pixel 20G1), image quality disorder (crosstalk phenomenon) may be generated being affected by coupling caused by the parasitic capacity component Cp. Specifically, in accordance with amplitude of the potential V (DLb) of the signal line DLb corresponding to the blue pixel 20B1, coupling (diving) is generated in the source of the green drive transistor 22 from the blue signal potential Vsig through the parasitic capacity component Cp. For example, as in the time period between the timings t14 and t15 or between the timings t16 and t17, both the source potential Vs and the gate potential Vg in the green drive transistor 22 are increased. In the case where a signal is written in the state that the gate potential Vg in the drive transistor 22 is increased, for example, as in the light emission time period T4 on and after the timing t18, the gate-to-source voltage Vgs is decreased compared to a case without crosstalk, and image quality disorder (crosstalk phenomenon) is generated.

Therefore, in this embodiment, as illustrated in FIG. 10, sizes 27R2, 27G2, and 27B2 of the color pixels 20R2, 20G2, and 20B2 are set unevenly according to the ratio of sizes of the color pixel circuits 26R, 26G, and 26B. Specifically, arrangement pitches 27R2, 27G2, and 27B2 of the anode electrodes 281R2, 281G2, and 281B2 are respectively set unevenly and arrangement pitches 27R2, 27G2, and 27B2 of the light emitting layers 29R2, 29G2, and 29B2 are respectively set unevenly, according to the ratio of sizes of the color pixel circuits 26R, 26G, and 26B. Thereby, the overlapping region between an anode electrode of one pixel and a signal line connected to a pixel adjacent thereto is not generated, and thus generation of the parasitic capacity component Cp is avoided.

As described above, in this embodiment, since sizes 27R2, 27G2, and 27B2 of the color pixels 20R2, 20G2, and 20B2 are set unevenly according to the ratio of sizes of the color pixel circuits 26R, 26G; and 26B, in addition to the effects in the foregoing first embodiment, generation of the parasitic capacity component Cp is able to be avoided, and image quality disorder (crosstalk phenomenon) is able to be eliminated. Accordingly, the pattern defect rate as the whole pixel circuit is able to be decreased without affecting the image quality.

Third Embodiment

Figure 15:
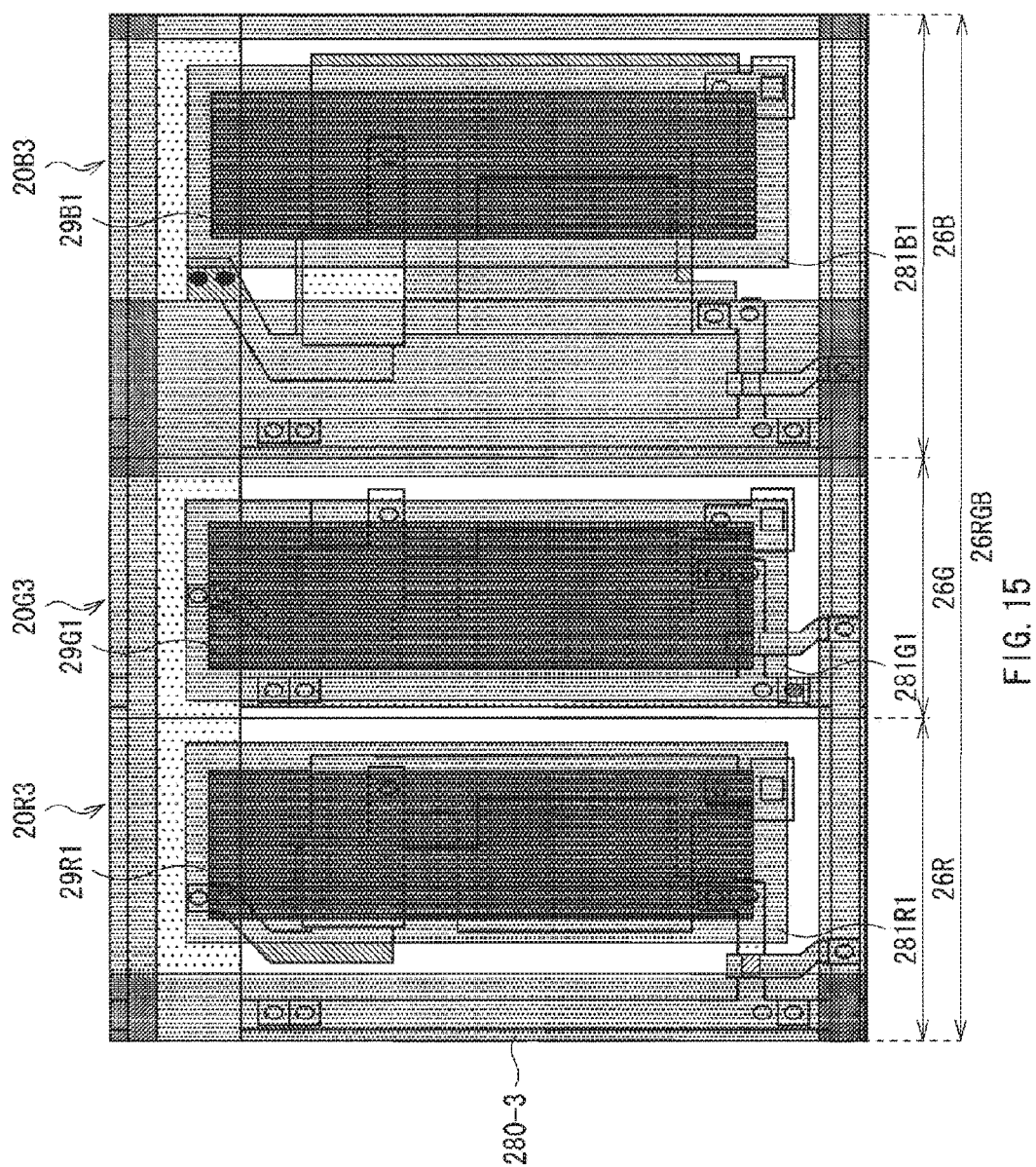
FIG. 15 is a plan view illustrating a structural example of a self-light emitting device of a pixel for each color according to a third embodiment.

FIG. 15 illustrates a planar structural example of color pixels 20R3, 20G3, and 20B3 and color pixel circuits respectively corresponding thereto, in a self-light emitting display unit (organic EL display unit) according to a third embodiment of the invention.

In the pixel circuit layer of this embodiment, in the same manner as that of the foregoing first embodiment, sizes of the color pixel circuits 26R, 26G and 26B respectively corresponding to the pixels 20R3, 20G3, and 20B3 for R, G, and B are respectively set unevenly within the pixel circuit according to a ratio of a size of the display drive current necessary for each organic EL device 24 to obtain the same light emission luminance, an area ratio between the color pixel circuits, of opposing regions (overlapping regions) of the polysilicon layer P1 and the second metal layer M2 in the drive transistors 22R1, 22G1, and 22B1 in the pixel circuits, or an area ratio between the color pixel circuits, of the accumulated capacitative elements 23R1, 23G1, and 23B1.

Further, in this embodiment, in the same manner as that of the foregoing first embodiment, the sizes of the color pixels 20R3, 20G3, and 20B3 are set evenly within the pixel.

However, in the organic EL device of this embodiment, differently from the foregoing first embodiment and the foregoing second embodiment, formation positions of the color pixels 20R3, 20G3, and 20B3 are set unevenly within the pixel according to a ratio of sizes of the color pixel circuits 26R, 26G, and 26B. Specifically, formation positions in the anode electrodes 281R1, 281G1, and 281B1 and the light emitting layers 29R1, 29G1, and 29B1 are set so that an anode electrode of one pixel and a signal line connected to a pixel adjacent thereto are not opposed to each other along the lamination direction (overlapping region is not generated), and an auxiliary wiring section 280-3 electrically connected to the cathode electrode 282 is formed in a niche in the formation regions of the anode electrodes 281R1, 281G1, and 281B1 and the light emitting layers 29R1, 29G1, and 29B1.

Thereby, differently from the foregoing first embodiment, the overlapping region between an anode electrode of one pixel and a signal line connected to a pixel adjacent thereto is not generated. Thus, generation of the parasitic capacity component Cp is avoided.

Further differently from the foregoing second embodiment, since the sizes of the color pixels 20R3, 20G3, and 20B3 (specifically, sizes of the light emitting layers 29R1, 29G1 and 29B1 and the like) are set evenly within the pixel. Thereby, difference of life time according to difference of view angle characteristics and difference of current densities for every color is avoided. Further, disorder of white balance and difference of vertical line sizes for R, G, and B are avoided.

Accordingly, in this embodiment, since the sizes of the color pixels 20R3, 20G3, and 20B3 (specifically, sizes of the light emitting layers 29R1, 29G1 and 29B1 and the like) are set evenly within the pixel, in addition to the effects in the foregoing second embodiment, the pattern defect rate as the whole pixel circuit is able to be decreased with no influence on the image quality without changing life characteristics and the like according to difference of view angle characteristics and difference of current densities for every color.

Fourth Embodiment

Figure 16:
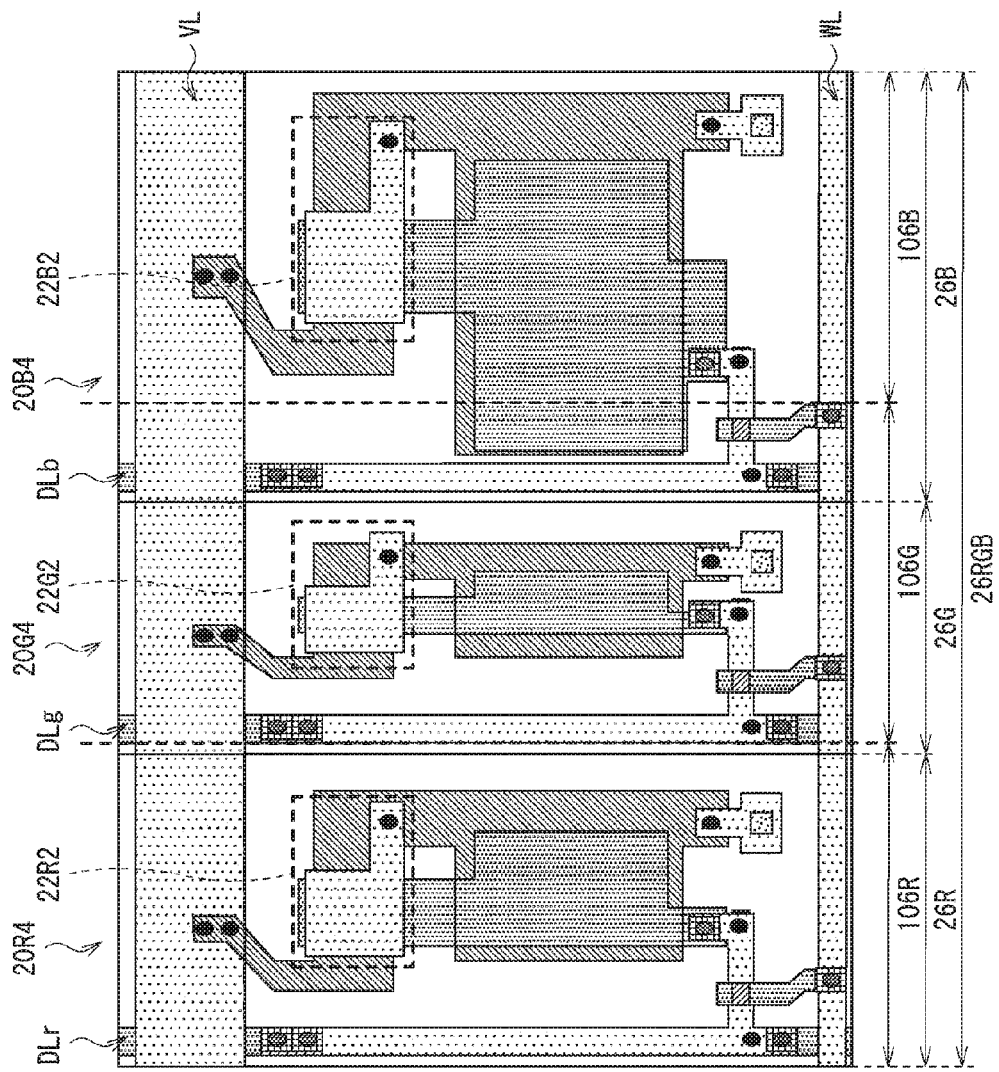
FIG. 16 is a plan view illustrating a structural example of a pixel circuit layer of a pixel for each color according to a fourth embodiment.
Figure 17:
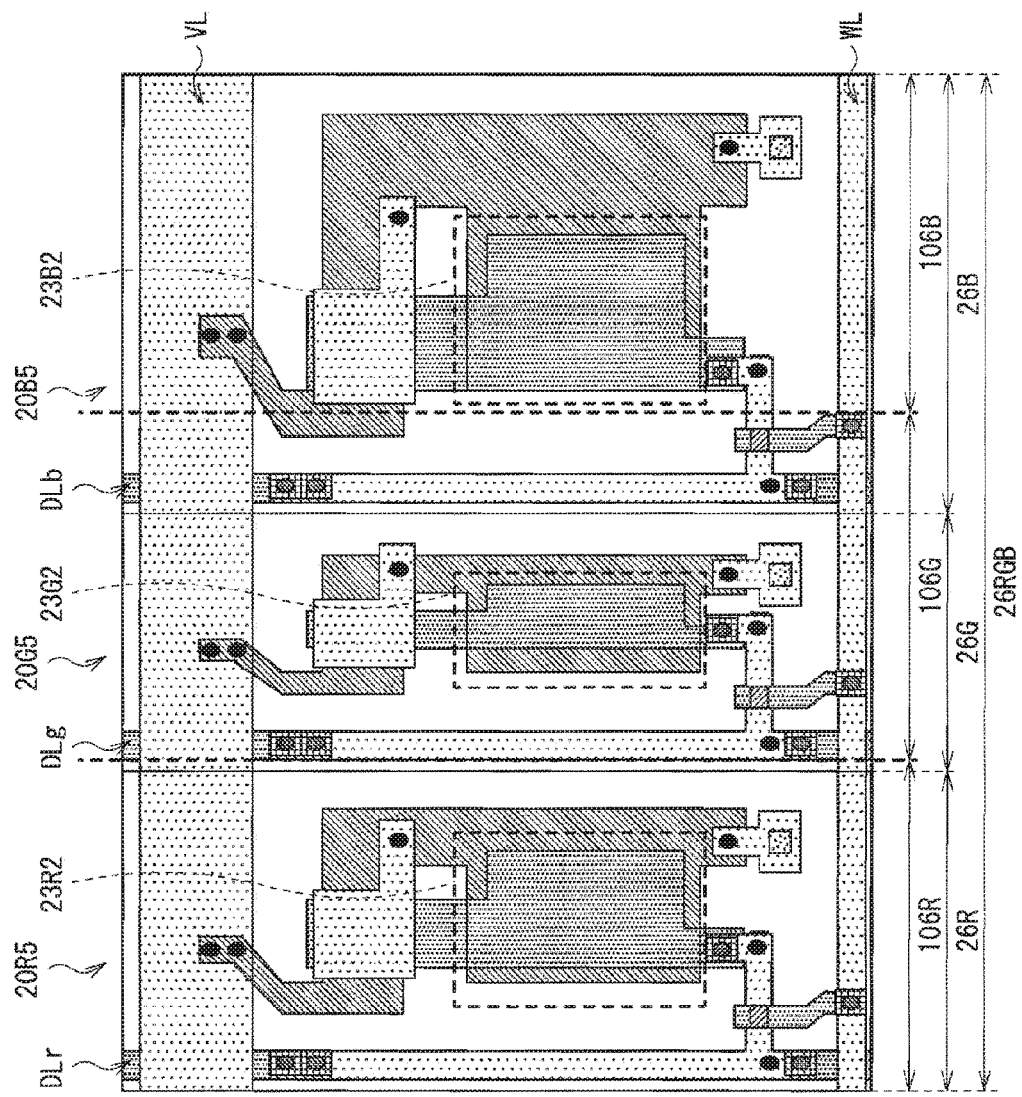
FIG. 17 is a plan view illustrating another structural example of a pixel circuit layer of a pixel for each color according to the fourth embodiment.

FIG. 16 illustrates a planar structural example of color pixels 20R4, 20G4, and 20B4 and color pixel circuits respectively corresponding thereto, in a self-light emitting display unit (organic EL display unit) according to a fourth embodiment of the invention. FIG. 17 illustrates a planar structural example of color pixels 20R5, 20G5, and 20B5 and color pixel circuits respectively corresponding thereto, in another self-light emitting display unit (organic EL display unit) according to this embodiment.

In the structural example illustrated in FIG. 16, drive transistors 22R2, 22G2, and 22B2 of the respective pixels 20R4, 20G4, and 20B4 are respectively arranged in their own color pixel regions, in the case where a color pixel circuit is arranged evenly for every pixel for R, G, and B (in the case of supposing that pixel sizes 106R, 106G and 106B are set evenly). That is, each of the drive transistors 22R2, 22G2, and 22B2 is located within an evenly-divided region defined as a color pixel circuit region which is to be generated when the pixel circuit is evenly divided into color pixel circuits, the evenly-divided region corresponding to the color pixel circuit to which each of the drive transistors actually belongs.

Further, in the structural example illustrated in FIG. 17, accumulated capacitative elements 23R2, 23G2, and 23B2 of the respective pixels 20R5, 20G5, and 20B5 are respectively arranged in their own color pixel regions, in the case where a color pixel circuit is arranged evenly for every pixel for R, G, and B (in the case of supposing that pixel sizes 106R, 106G, and 106B are set evenly). That is, each of the accumulated capacitative elements 23R2, 23G2, and 23B2 is located within an evenly-divided region defined as a color pixel circuit region which is to be generated when the pixel circuit is evenly divided into color pixel circuits, the evenly-divided region corresponding to the color pixel circuit to which each of the accumulated capacitative elements actually belongs.

Due to the foregoing structures, differently from the foregoing first embodiment, the overlapping region between an anode electrode of one pixel and a signal line connected to a pixel adjacent thereto is not generated. Accordingly, generation of the parasitic capacity component Cp is avoided.

As described above, in this embodiment, each of the drive transistors 22R2, 22G2, and 22B2 or each of the accumulated capacitative elements 23R2, 23G2, and 23B2 is located within an evenly-divided region defined as a color pixel circuit region which is to be generated when the pixel circuit is evenly divided into color pixel circuits, the evenly-divided region corresponding to the color pixel circuit to which each of the drive transistors or each of the accumulated capacitative elements actually belongs. Thus, in addition to the effects of the foregoing first embodiment, generation of the parasitic capacity component Cp is able to be avoided, and disorder of image quality (crosstalk phenomenon) is able to be eliminated. In result, the pattern defect rate as the whole pixel circuit is able to be decreased with no influence on the image quality.

Also, each of the signal lines DLr, DLg, and DLb corresponding to each pixel may be located within an evenly-divided region defined as a color pixel circuit region which is to be generated when the pixel circuit is evenly divided into color pixel circuits, the evenly-divided region corresponding to the color pixel circuit to which each of the signal lines actually belongs. In this case, disorder of image quality (crosstalk phenomenon) is able to be eliminated, and the pattern defect rate as the entire whole circuit is able to be decreased with no influence on the image quality as well.

Further, more generally, if, regarding at least one or more groups selected from the three groups of the drive transistors 22R2, 22G2, and 22B2, the accumulated capacitative elements 23R2, 23G2, and 23B2, and the signal lines DLr, DLg, and DLb, each element in one group is located within an evenly-divided region defined as a color pixel circuit region which is to be generated when the pixel circuit is evenly divided into color pixel circuits, the evenly-divided region corresponding to the color pixel circuit to which each element actually belongs, the effect of this embodiment is able to be obtained.

APPLICATION EXAMPLES

Next, a description will be given of application examples of the self-light emitting display unit described in the foregoing first to fourth embodiments with reference to FIG. 18 to FIG. 22G. The self-light emitting display unit described in the foregoing first to fourth embodiments (specifically, the organic EL display unit) is able to be applied to an electronic device in any field for displaying a picture signal inputted from outside or a picture signal generated inside as an image or a picture, such as a television device, a digital camera, a notebook personal computer, a portable terminal device such as a mobile phone, and a video camera.

First Application Example

Figure 18:
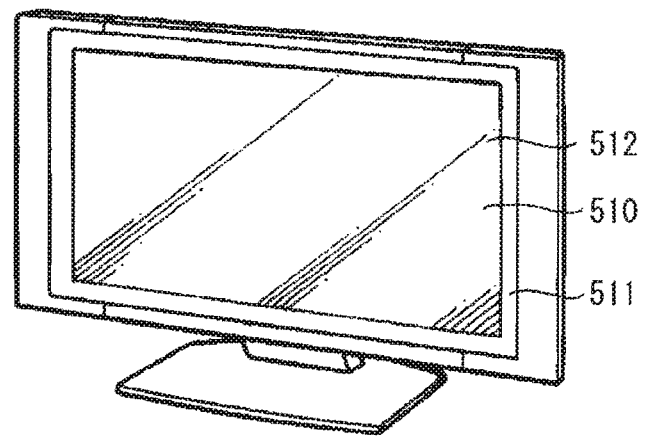
FIG. 18 is a perspective view illustrating an appearance of a first application example of the self-light emitting display unit of the invention.

FIG. 18 is an appearance of a television device to which the self-light emitting display unit of the foregoing embodiments is applied. The television device has, for example, a picture display screen section 510 including a front panel 511 and a filter glass 512. The picture display screen section 510 is configured of the self-light emitting display unit according to the foregoing embodiments and the like.

Second Application Example

Figure 19A:
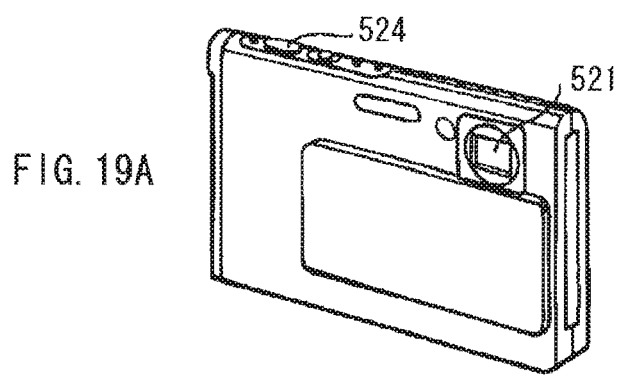
FIG. 19A is a perspective view illustrating an appearance viewed from the front side of a second application example.
Figure 19B:
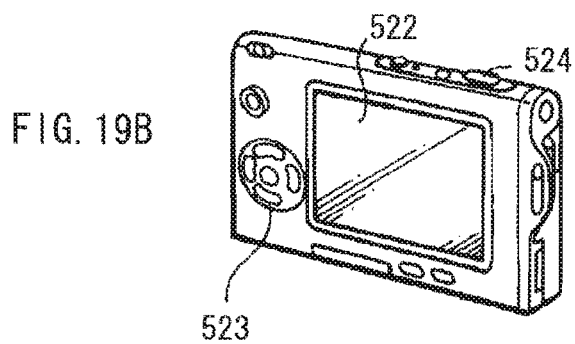
FIG. 19B is a perspective view illustrating an appearance viewed from the rear side of the second application example.

FIGS. 19A and 19B are an appearance of a digital camera to which the self-light emitting display unit of the foregoing embodiments is applied. The digital camera has, for example, a light emitting section for a flash 521, a display section 522, a menu switch 523, and a shutter button 524. The display section 522 is configured of the self-light emitting display unit according to the foregoing embodiments.

Third Application Example

Figure 20:
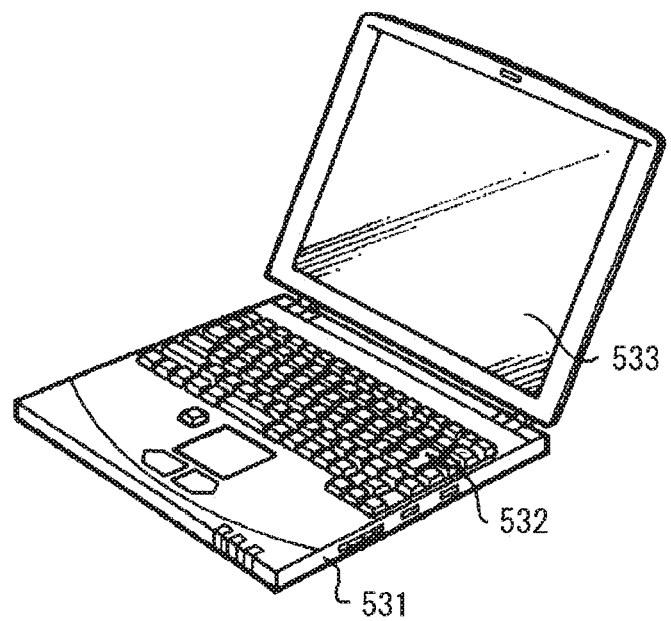
FIG. 20 is a perspective view illustrating an appearance of a third application example.

FIG. 20 is an appearance of a notebook personal computer to which the self-light emitting display unit of the foregoing embodiments is applied. The notebook personal computer has, for example, a main body 531, a keyboard 532 for operation of inputting characters and the like, and a display section 533 for displaying an image. The display section 533 is configured of the self-light emitting display unit according to the foregoing embodiments.

Fourth Application Example

Figure 21:
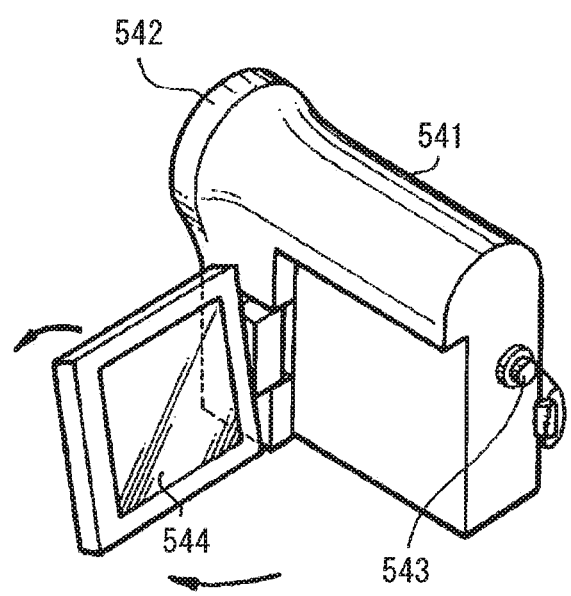
FIG. 21 is a perspective view illustrating an appearance of a fourth application example.
Figure 22:
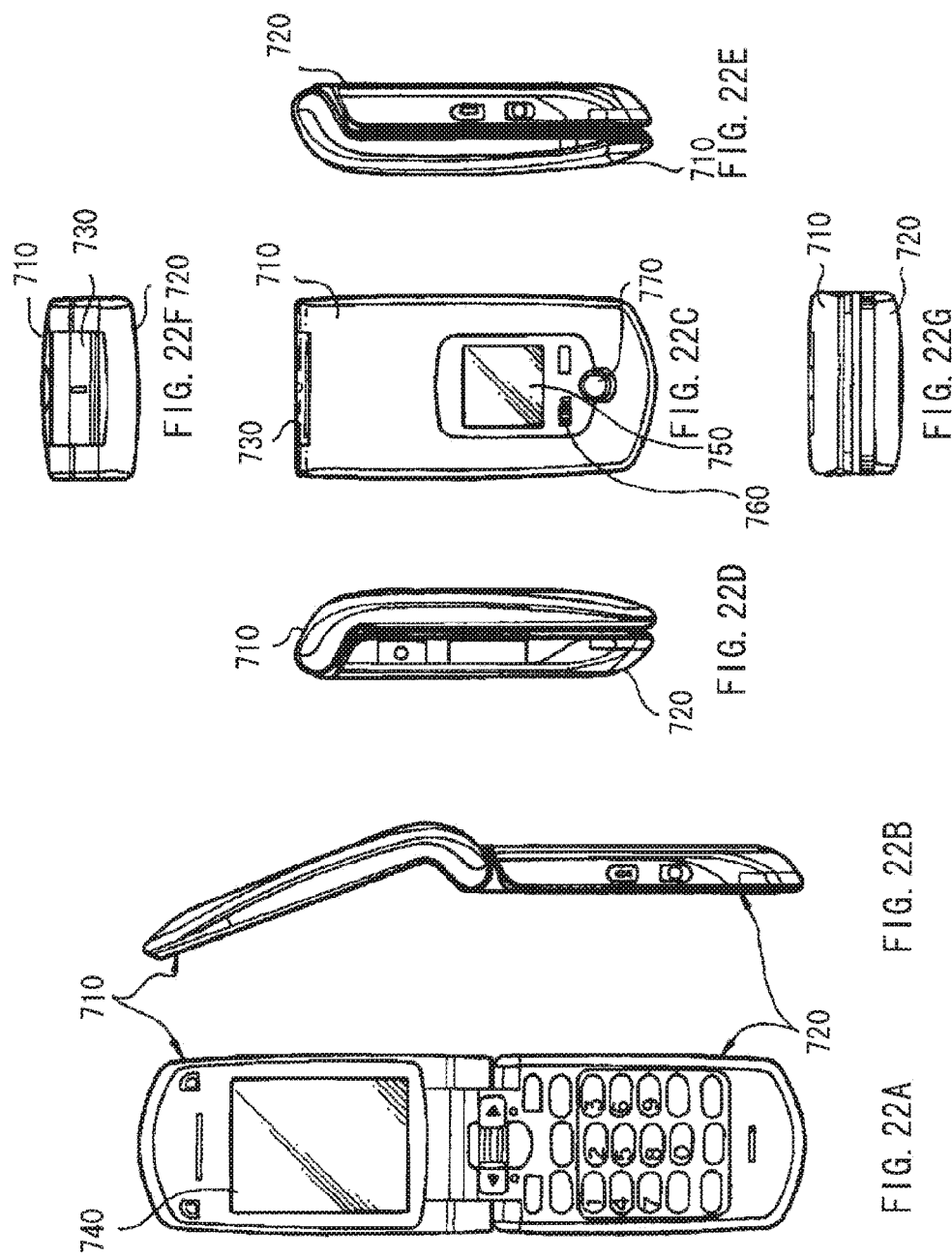
FIG. 22A is an elevation view of a fifth application example unclosed.
FIG. 22B is a side view thereof.
FIG. 22C is an elevation view of the fifth application example closed.
FIG. 22D is a left side view thereof.
FIG. 22E is a right side view thereof.
FIG. 22F is a top view thereof.
FIG. 22G is a bottom view thereof.

FIG. 21 is an appearance of a video camera to which the self-light emitting display unit of the foregoing embodiments is applied. The video camera has, for example, a main body 541, a lens for shooting an object 542 provided on the front side face of the main body 541, a start/stop switch in shooting 543, and a display section 544. The display section 544 is configured of the self-light emitting display unit according to the foregoing embodiments.

Fifth Application Example

FIGS. 22A to 22G are an appearance of a mobile phone to which the self-light emitting display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is configured of the self-light emitting display unit according to the foregoing embodiments.

While the invention has been described with reference to the first to fourth embodiments and the application examples, the invention is not limited to the foregoing embodiments and the like, and various modifications may be made.

For example, in the foregoing embodiments and the like, while the description has been given of the case that sizes of the color pixel circuits 26R, 26G and 26B or sizes of the color pixels 27R2, 27G2, and 27B2 are expressed by the above-mentioned expressions 1 to 3, embodiments of uneven arrangement are not limited thereto.

Figure 23:
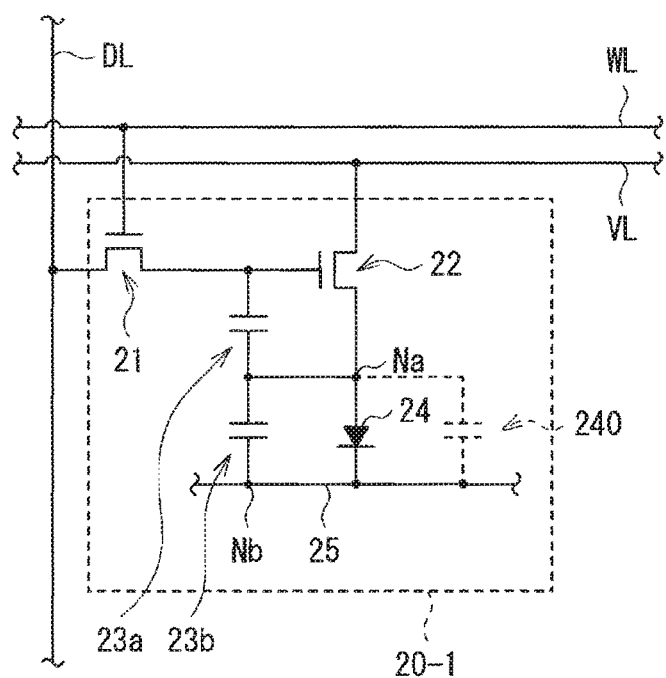
FIG. 23 is a circuit diagram illustrating a structure of a pixel circuit according to a modified example of the invention.
Figure 24:
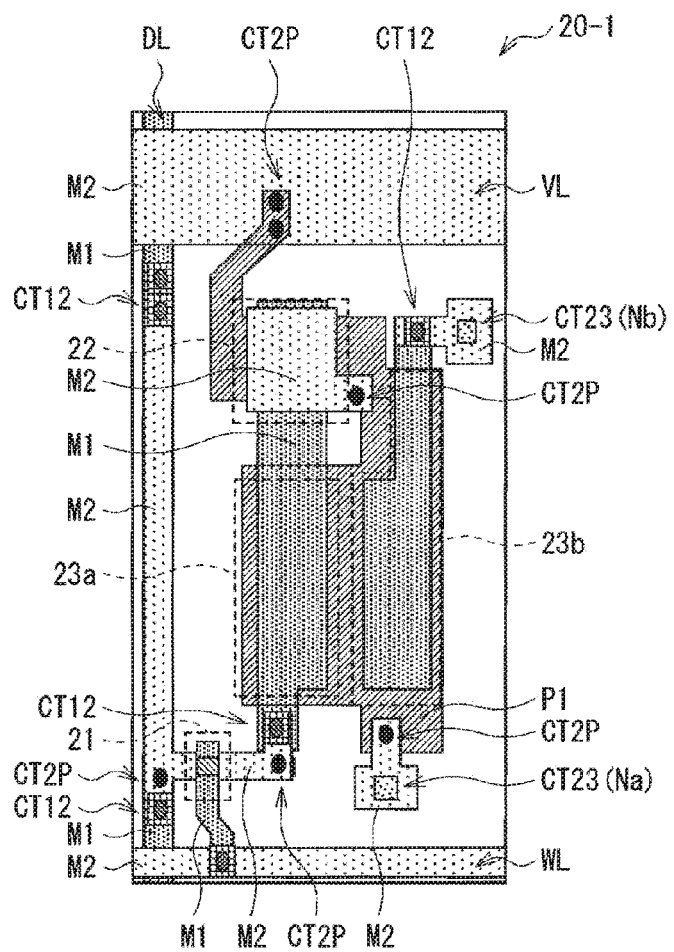
FIG. 24 is a plan view illustrating a structure of the pixel circuit illustrated in FIG. 23.
Figure 25:
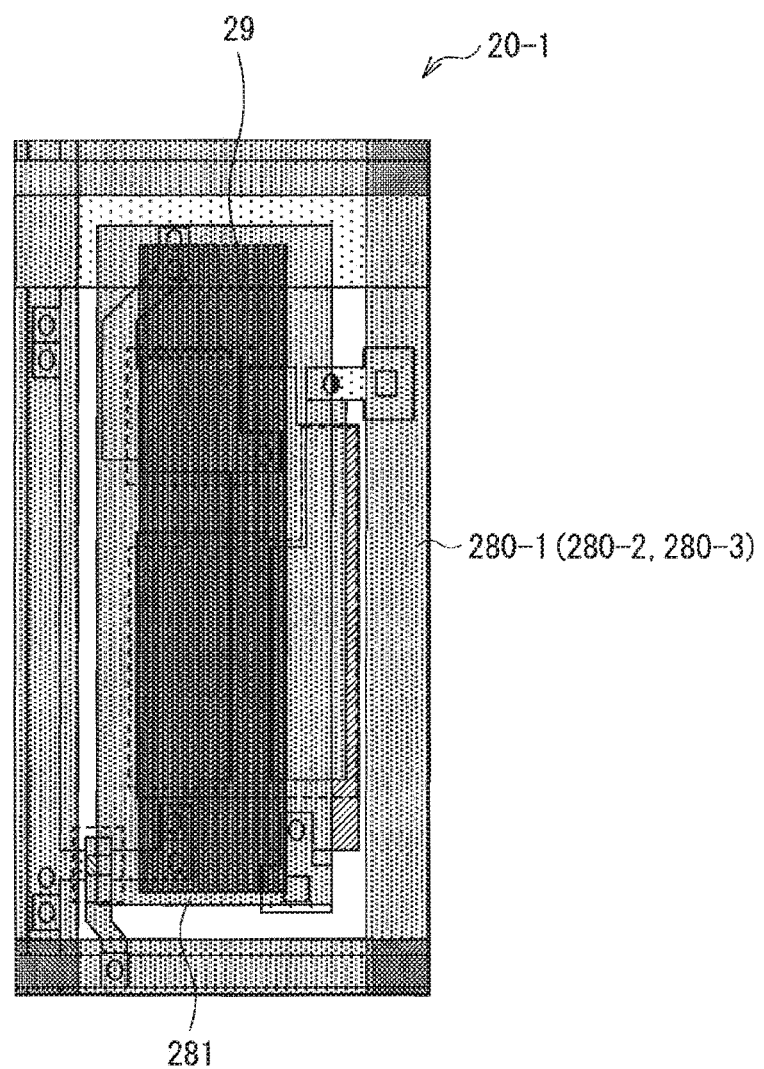
FIG. 25 is a plan view illustrating a structure of a self-light emitting device corresponding to the pixel circuit illustrated in FIG. 23.

Further, for example, as the pixel circuit in a pixel 20-1 illustrated in FIG. 23 to FIG. 25, the invention is able to be applied to a case in which a parasitic capacity component 240 is generated in parallel with the organic EL device 24 (capacity values are different for every color), and the difference of the capacity values for every color is adjusted by two accumulated capacitative elements 23a and 23b and the like.

In addition, in the foregoing embodiments and the like, the description has been given of the structure composed of the pixels for R, G, and B (in the case of the three color pixels). However, the invention is not limited to such a structure. That is, for example, the invention is able to be applied to a structure having pixels for a voluntarily number of colors such as a case of four color pixels obtained by adding w (white) pixels thereto, a case of two color pixels, and a case of five color pixels.

Further, in the foregoing embodiments and the like, the description has been given of the case that the self-light emitting device is an organic EL device. However, the invention is also applied to a self-light emitting display unit using other self-light emitting device (for example, an inorganic EL device or LED) or the like.

It should be understood by those skilled in the art that various modifications, combinations, sub-combinations and alterations may occur depending on design requirements and other factors insofar as they are within the scope of the appended claims or the equivalents thereof.

What is claimed is:

1. An organic EL display device comprising:
   a pixel layer including a first color pixel emitting blue light, a second color pixel emitting green light, and a third color pixel emitting red light; and
   a pixel circuit layer including a first color pixel circuit, a second color pixel circuit, and a third color pixel circuit,
   wherein
   the first color pixel has a first anode electrode,
   the second color pixel has a second anode electrode,
   the third color pixel has a third anode electrode,
   the first color pixel circuit includes a first capacitor, a first sampling transistor, and a first drive transistor configured to flow a drive current to the first color pixel,
   the second color pixel circuit includes a second capacitor, a second sampling transistor, and a second drive transistor configured to flow a drive current to the second color pixel,
   the third color pixel circuit includes a third capacitor, a third sampling transistor, and a third drive transistor configured to flow a drive current to the third color pixel,
   a size of the first anode electrode is greater than each of a size of the second anode electrode and a size of the third anode electrode,
   a portion of the first anode electrode overlaps with a portion of the first capacitor in a plan view,
   a portion of the second anode electrode overlaps with a portion of the second capacitor in the plan view, and
   a portion of the third anode electrode overlaps with a portion of the third capacitor in the plan view.

2. The organic EL display device of claim 1, wherein a portion of an emitting region of the first color pixel overlaps with a portion of the first drive transistor in the plan view.

3. The organic EL display device of claim 1, further comprising:
   a first data signal line connected to the first color pixel circuit, and
   wherein a portion of the first data signal line overlaps with a portion of the second anode electrode in the plan view.

4. The organic EL display device of claim 3, wherein a portion of an emitting region of the first color pixel overlaps with a portion of the first drive transistor in the plan view.

5. The organic EL display device of claim 1, wherein a size of the first drive transistor is different from a size of the second drive transistor.

6. The organic EL display device of claim 1, wherein a size of the first capacitor is different from a size of the second capacitor.

\* \* \* \* \*